United States Patent [19]

Ogawa et al.

[11] Patent Number: 5,545,598
[45] Date of Patent: Aug. 13, 1996

[54] HIGH HEAT CONDUCTIVE BODY AND WIRING BASE SUBSTRATE FITTED WITH THE SAME

[75] Inventors: Kouki Ogawa; Kozo Yamasaki; Naomiki Kato, all of Nagoya, Japan

[73] Assignee: NGK Spark Plug Co., Ltd., Nagoya, Japan

[21] Appl. No.: 195,085

[22] Filed: Feb. 14, 1994

[30] Foreign Application Priority Data

Feb. 12, 1993 [JP] Japan .................... 5-047353
Feb. 12, 1993 [JP] Japan .................... 5-047354
Dec. 24, 1993 [JP] Japan .................... 5-347667

[51] Int. Cl.$^6$ .................................. B32B 17/00
[52] U.S. Cl. .................. 501/127; 428/632; 428/688; 428/702; 252/512; 252/515; 75/232; 75/235; 75/248
[58] Field of Search ............. 501/88, 127; 407/119; 428/210, 209, 688, 689, 697, 702, 633, 632; 252/71, 512, 515; 75/232, 235, 248

[56] References Cited

U.S. PATENT DOCUMENTS

| | | | |
|---|---|---|---|
| 4,072,532 | 2/1978 | Fletcher | 501/98 |
| 4,109,377 | 8/1978 | Blazick et al. | 29/626 |
| 4,485,150 | 11/1984 | Tsumo | 428/633 |
| 4,734,233 | 3/1988 | Toda | 428/209 |
| 5,060,049 | 10/1991 | Yamasaki | 357/70 |
| 5,099,388 | 3/1992 | Ogawa | 361/321 |
| 5,164,246 | 11/1992 | Tamaka | 428/210 |
| 5,293,069 | 3/1994 | Kato | 257/698 |

FOREIGN PATENT DOCUMENTS

| | | |
|---|---|---|
| 0281220 | 9/1988 | European Pat. Off. . |
| 60-10633 | 1/1985 | Japan . |
| 62-218 | 1/1987 | Japan . |
| 62-18623 | 4/1987 | Japan . |
| 62-21861 | 5/1987 | Japan . |
| 63-31394 | 8/1988 | Japan . |
| 3-211790 | 9/1991 | Japan . |
| 4-116960 | 4/1992 | Japan . |

*Primary Examiner*—Ellis Robinson
*Assistant Examiner*—Timothy M. Speer
*Attorney, Agent, or Firm*—Foley & Lardner

[57] ABSTRACT

Disclosed is a high heat conductive body which consists of 30–99 wt. % of at least one of molybdenum and tungsten and 1 or more wt. % ceramic. A wiring base substrate fitted with such a high heat conductive body is also disclosed. Methods of producing such a high heat conductive body and a wiring base substrate are further disclosed.

8 Claims, 13 Drawing Sheets

SAMPLE c    W 100wt% d    W 99wt% + $Al_2O_3$ 1% e    W 97wt% + $Al_2O_3$ 3% f    W 97wt% + $Al_2O_3$ 1% + $SiO_2$ 1% + MgO 0.5% + CaO 0.5%

HIGH HEAT CONDUCTIVE BODY AND WIRING BASE SUBSTRATE FITTED WITH THE SAME

BACKGROUND OF THE INVENTION

1. Field of the Invention

The present invention relates to a high heat conductive body which can attain efficient heat radiation with ease. The present invention further relates to a wiring base substrate for integrated circuits, fitted with such a high heat conductive body. The present invention still further relates to a method of producing such a high heat conductive body and a wiring base substrate fitted with the same.

2. Description of the Prior Art

In case the emission of heat from an integrated circuit chip is small, a wiring base substrate usually used for installation of such an integration circuit chip is of the kind in which the circuit wiring is simply formed between the insulation layers or on the exterior surface thereof.

However, in accordance with an increasing tendency that the integrated circuit chip becomes larger in size, higher in integration, faster in operation, and larger in power, the emission of heat from the integrated circuit chip in operation increases. Since such heat may be causative of malfunction of the integrated circuit and thus lowers the reliability, there is an increasing demand for a wiring base substrate having a high heat radiating property or function for radiating the heat coming from the integrated circuit chip rapidly.

Further, in case the material forming the integrated circuit chip and the material forming the wiring base substrate are different in coefficient of thermal expansion from each other, there arises a difference in thermal expansion in response to the emission of heat by the integrated circuit. By such a difference in thermal expansion, such a case may be caused in which the integrated circuit chip is subjected to a stress and damaged thereby or the integrated circuit chip is peeled off from the place where it is fixedly attached to the wiring base substrate, thus lowering the reliability of an associated electronic device.

In order that the reliability is maintained unchanged even if the emission of heat increases, it is required that the material for a wiring base substrate have a thermal expansion efficiency close to that of the material for the integrated circuit chip.

The following methods are known for attaining high heat radiation.

One known method is, as shown in FIG. 22, to attach heat radiating fins "F" to the bottom surface of the wiring base substrate 101.

Another known method is, as shown in FIGS. 23 and 24, to attach to the heat insulation layer 103 of the wiring base substrate 101 a heat radiating member or element "S" which is so-called a heat spreader or a heat slug and made of a high heat conductive material such as a Cu-W alloy.

In the meantime, in FIGS. 22–24, 102 is an integrated circuit chip, 104 is input/output terminal, 105 is a sealing cover, and 110 and 111 are joining layers such as brazing layers.

A further method is to form the insulation layer of the wiring base substrate from a high heat conductive material such as aluminum nitride in place of alumina usually used.

On the other hand, fin order to increase the reliability of an electronic device, it has been proposed to form the insulation layers of the wiring base substrate from a material the coefficient of thermal expansion of which is close to that of silicon which is a representative of all materials for integrated circuits such as aluminum nitride, mullite, glass ceramic, etc.

However, the above described conventional methods are encountered by the following problems.

Firstly, the material for a heat emitting member such as a heat spreader or heat slug needs to be close in coefficient of thermal expansion to that of the wiring base substrate material and the integrated circuit material since if not the joining of them is difficult. So, copper which is larger not only in heat conductivity but in coefficient of thermal expansion cannot be used. Accordingly, it is obliged to use a Cu-W alloy which approximates in coefficient of thermal expansion to alumina.

However, the Cu-W alloy is costly since it needs be produced by a difficult infiltration process and further since it has a difficulty in cutting.

Secondly, in order to attach the radiating fins or heat slugs made of metal to the wiring base substrate, a difficult ceramic-metal brazing technique is necessitated. Further, since a ceramic body and metallic body cannot be brazed together directly, it is necessitated that a metalizing layer is firstly formed on the wiring base substrate, then an electroplating layer is formed on the metalizing layer, and thereafter the brazing is performed.

This is because the ceramic material for the wiring base substrate has an insulating property and is not electrically conductive, so an electroplating layer cannot be formed on the surface of the wiring base substrate by an electroplating process.

Accordingly, a difficult process such as a process for firstly performing printing and baking of metallic paste to form a metalizing layer and then applying electroplating to the metalized layer is necessitated.

Further, in case the heat slug "S" is fitted as shown in FIG. 24, formation of the metalized layer or defective brazing may cause a crack or cracks at the joint 110 between the heat slug and the ceramic substrate or insufficiency in fitting, thus causing a problem on the reliability such as one related to the air tightness of the wiring base substrate.

Thirdly, aluminum nitride has a high heat conductive property and is therefore hopeful as a material in place of alumina but its raw material cannot be obtained at low price and further the technique of manufacturing a substrate therefrom is not established, resulting in a high cost and an unstable property that the material of itself is easily affected by water.

Further, for the joining of the radiating fins, integrated circuits, etc., it is indispensable to form a metallizing layer from metallic paste.

SUMMARY OF THE INVENTION

According to an aspect of the present invention, there is provided a high heat conductive body which consists of 30–99 wt. % of at least one of molybdenum and tungsten and 1 or more wt. % ceramic.

According to a further aspect of the present invention, there is provided a wiring base substrate fitted with the above described high heat conductive body and having an insulation layer connected directly and integrally to at least part of the high heat conductive body.

According to a further aspect of the present invention, there is provided a method of producing a high heat conductive body, which comprises the steps of: preparing a mixture consisting of 30–99 wt. % of, when converted to metal, at least one of molybdenum, tungsten, molybdenum compound and tungsten compound and 1 or more wt. % of ceramic or of, when converted to ceramic after firing, a composition to be formed into ceramic after firing; forming a green sheet from the mixture; and punching the green sheet to form a punched out green sheet of a desired shape; and firing the punched out green sheet.

The above high heat conductive body and the wiring base substrate fitted with the same are effective for solving the above noted problems inherent in the prior art device.

It is accordingly an object of the present invention to provide a high heat conductive body which is particularly suited for use as a heat radiating member for a wiring base substrate for integrated circuit packages.

It is a further object of the present invention to provide a high heat conductive body of the above described character which can be produced at low cost and by using the process for producing a conventional wiring base substrate.

It is a further object of the present invention to provide a high heat conductive body of the above described character which can reduce the thermal stress arising at the joint between a wiring base substrate and an integrated circuit chip.

It is a further object of the present invention to provide a wiring base substrated fitted with a high heat conductive body of the above described character.

It is a further object of the present invention to provide a method of producing a high heat conductive body of the above described character.

It is a further object of the present invention to provide a method of producing a wiring base substrate of the above described character.

DETAILED DESCRIPTION OF THE PREFERRED EMBODIMENTS

Figure 1:
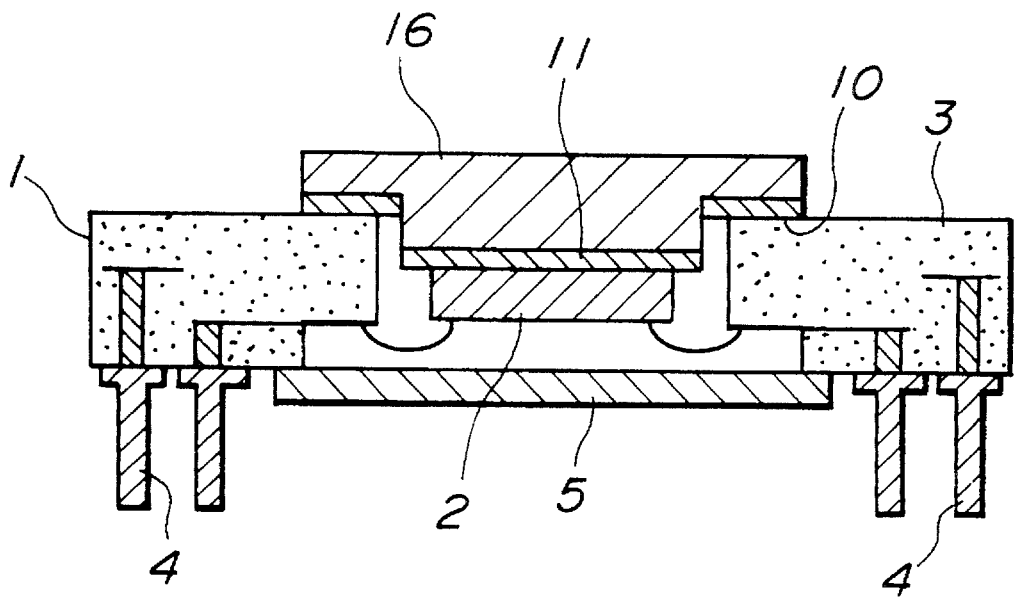
FIG. 1 is a sectional view of a high heat conductive body according to an embodiment of this invention which is incorporated in a ceramic base substrate for an integrated circuit package to serve as a heat radiating element.

A high heat conductive body of this invention, as described above, consists of 30–99 wt. % of at least one of molybdenum and tungsten and 1 or more wt. % ceramic.

In this connection, 1 or more wt. % ceramic contained in a high heat conductive body should accept the widest interpretation in the art. Accordingly, not only polycrystalline glass but crystallized glass is included in the scope of the term.

However, it is the case the heat conductivity ceramic is lower than that of molybdenum that the heat conductivity is increased by the containment of molybdenum. For example, ceramic containing alumina, mullite or glass ceramic as a main component is such a case. Particularly, alumina and mullite are desirable since they are low in heat conductivity and fired at the temperature close to that of molybdenum.

Further, the high heat conductive body is desirable since it has an electric conductivity and therefore various electroplating layer can be formed directly on a desired portion of the high heat conductive body by electroplating for enabling attachment of, for example, a heat radiating fin to the high heat conductive body directly by brazing.

In case the content of at least one of molybdenum and tungsten in the high heat conductive body is 60–99 wt. % and the ceramic in the high heat conductive body contains alumina as a main component, the heat conductivity is high and furthermore the coefficient of thermal expansion is low, thus coming to possess a coefficient of thermal expansion close to that of silicon for instance and making it possible to mitigate or reduce the thermal stress arising between a silicon semiconductor and the high heat conductive body.

On the other hand, in case the content of at least one of molybdenum and tungsten contained in the high heat conductive body is 30–60 wt. % and the ceramic in the high heat conductive body contains alumina as a main component, the coefficient of thermal expansion is relatively high and close to that of gallium arsenic semiconductor, thus making it possible to mitigate or reduce the thermal stress arising between the gallium arsenic semiconductor and the high heat conductive body.

A high heat conductive body according to another embodiment of this invention consists of two or more layers which are integrally joined together, wherein the coefficients of thermal expansion of the layers simply vary in the direction from one of opposite side surfaces of the high heat conductive body to the other of the side surfaces. In this case, by interposing the high heat conductive body between the elements or parts of the different coefficients of thermal expansion, the thermal stress arising between the two elements or parts can be mitigated or reduced.

In this connection, in case where the two or more layers constituting the high heat conductive body do not contain tungsten but molybdenum and the content of molybdenum in the two or more layers varies simply in the direction from one side surface of the high heat conductive body to the other side surface, a variation of an inverse rate of shrinkage at the time of firing is gradual, so the stress caused at the time of firing in the high heat conductive body is small and the two or more layers are joined together mope firmly.

In the meantime, the term "inverse rate of shrinkage" herein used is a ratio of a length of a compacted body before firing to the corresponding length of the body after firing, i.e., 1: shrinkage or inverse shrinkage.

Further, the similar result can be obtained in the case the two or more layers constituting the high heat conductive body does not contain molybdenum but tungsten or contains molybdenum and tungsten in a nearly equal amount.

A high heat conductive body according to a further embodiment of the present invention comprises a heat conductive post containing molybdenum or tungsten as a main component and penetrating through the high heat conductive body between a main surface and a rear surface opposite to the main surface of the high heat conductive body. In this case, by the effect of the heat conductive post, heat can be radiated more rapidly from the main surface of the high heat conductive body to the rear surface.

Accordingly, a wiring base substrate fitted with such a high heat conductive body and having an insulation layer directly and integrally attached to at least a portion of the high heat conductive body, has a high heat radiating property and is capable of radiating heat from the insulation layer rapidly. Further, such a wiring base substrate can have the better air-tightness than that in the case of connection of the high heat conductive body by brazing and therefore a high reliability.

Particularly, in case the insulation layer contains alumina as a main component and the wiring base substrate is fitted with a high heat conductive body, the ceramic in which high heat conductive body contains alumina as a main component, the insulation layer and the high heat conductive body are joined together more firmly, thus making it possible to attain a high reliability.

Further, in case the insulation layer contains alumina as a main component and the ceramic in the high heat conductive body contains one of $SiO_2$, MgO and CaO, the insulation layer and the high heat conductive body are joined together more firmly by the effect of the glass component.

Further, in case the insulation layer contains alumina as a main component and the high heat conductive body contains molybdenum and tungsten in a nearly equal amount, the inverse rate of shrinkage does not change suddenly between the insulation layer and the high heat conductive body and therefore the both can be joined together with ease.

In this connection, the wiring base substrate having an insulation layer of thick film glass and fitted with a high heat conductive body can make the thickness of the insulation layer thinner, thus making it possible to attain a thin type wiring base substrate.

Further, in case the insulation layer is made of polyimide, a thinner insulation layer can be obtained and furthermore the dielectric constant is low. So, this insulation layer is preferable for installation of integrated circuits of high-seed operation.

In accordance with the present invention, there is provided a method of producing a high heat conductive body, which comprises the steps of: preparing a mixture consisting of 30–99 wt. % of, when converted to metal, at least one of molybdenum, tungsten, molybdenum compound and tungsten compound and 1 or more wt. % of ceramic or of, when converted to ceramic after firing, a composition to be formed into ceramic after firing; forming a green sheet from the mixture; and punching the green sheet to form a punched out green sheet of a desired shape; and firing the punched out green sheet. This method is similar to that for producing a conventional wiring base substrate and makes it possible to produce a high heat conductive body at a low cost.

In this connection, in case a plurality of punched out green sheets for a high heat conductive body are laminated and thereafter fired, a high heat conductive body of a desired shape can be obtained without using an expensive press die but by lamination of the sheets.

In accordance with the present invention, there is also provided a method of producing a wiring base substrate fitted with a high heat conductive body, which comprises the steps of: forming a green sheet from insulation ceramic or a composition to be formed into insulation ceramic after firing; punching the green sheet to form one or more punched out sheets of a desired shape for the wiring base substrate; laminating the one or more punched out sheets for the wiring base substrate and the one or more punched out sheets for the high heat conductive body; and firing the laminated sheets for the wiring base substrate and the high heat conductive body. This method makes it possible to produce a wiring base substrate fitted with a high heat conductive body by using a process for producing a conventional wiring base substrate and therefore makes it possible to produce a wiring base substrate fitted with a high heat conductive body at a low cost.

In this connection, in case the insulation ceramic or the composition to be formed into the insulation ceramic after firing, in the punched out green sheets for the wiring base substrate contains alumina as a main component and the ceramic or the composition to be formed into the ceramic after firing contains alumina as a main component, the insulation layer and the high heat conductive body are connected to each other more firmly.

Further, in case where the insulation ceramic or the composition to be formed into the insulation ceramic after firing, in the punched out green sheets for the wiring base substrate contains alumina as a main component and the ceramic or the composition to be formed into the ceramic after firing contains one of $SiO_2$, MgO and CaO, the glass component is diffused into the insulation ceramic layer, and therefore the insulation layer and the high heat conductive body are joined together more firmly.

Further in case the insulation ceramic or the composition to be formed into the insulation ceramic after firing, in the punched out green sheets for the wiring base substrate contains alumina as a main component and the punched out green sheets for the high heat conductive body contains molybdenum and tungsten, when converted to metal, in a nearly equal amount, the inverse rates of shrinkage of the insulation layer and the high heat conductive body approximate to each other, and therefore the both are joined together more firmly.

Many of ceramics are low in heat conductivity as compared with metal. For example, the heat conductivity of most popular alumina is 17 W/m.°C. and the heat conductivity of mullite is 4 W/m.°C.

In contrast to this, the heat conductivities of molybdenum and tungsten are 160 W/m °C. and 140 W/m.°C., respectively. Further, the melting points of molybdenum and tungsten are high and their firing temperature are substantially equal to that of alumina and mullite. So, a high heat conductive body which is formed by firing from a mixture of ceramic such as alumina and molybdenum or tungsten, can be used as a heat radiating element having a high heat radiating property and can be connected to a wiring base substrate to make the wiring base substrate have a high heat radiating property.

Further, by the influence of molybdenum (coefficient of thermal expansion is $5.5 \times 10^{-6}$/°C.) and tungsten (coefficient of thermal expansion is $4.4 \times 10^{-6}$/°C.) which are lower in coefficient of thermal expansion than alumina (coefficient of thermal expansion is $6.7 \times 10^{-6}$/°C.), the coefficient of thermal expansion of the high heat conductive body decreases with increase of the content of molybdenum, etc.

That is, the high heat conductive body containing 60–99 wt. % molybdenum or tungsten and ceramic the main component of which is alumina, particularly has a high heat conductivity and therefore an excellent heat radiating property. Further, such a high heat conductive body has a coefficient of thermal expansion which is equal to or lower than $6.0 \times 10^{-6}$/°C. and thus close to that ($4.2 \times 10^{-6}$/°C.) of silicon. Accordingly, in case, as shown in FIG. 1, the high heat conductive body 16 is used as a heat radiating element and an integrated circuit 2 consisting of a silicon semiconductor is attached thereto, a resulting thermal stress is small as compared with the case in which conventional alumina ceramic and Cu-W alloy are used.

Accordingly, it never occurs such a case that erroneous operation and peeling off of a silicon integrated circuit is caused due to stress applied thereto, thus making it possible to obtain a wiring base substrate which is thermally stable and reliable.

On the other hand, in case the high heat conductive body contains 30–60 wt. % molybdenum or tungsten and ceramic the main component of which is alumina, the heat conductivity is low as compared with the above described example but the coefficient of thermal expansion is equal to or larger than $6.0 \times 10^{-6}$/°C. So, this high heat conductive body approximates to such one of a high coefficient of thermal expansion as for example a gallium arsenic semiconductor (the coefficient of thermal expansion is $7.0 \times 10^{6}$/°C.), so that when an integrated circuit consisting of a gallium arsenide semiconductor is attached to the high heat conductive body it becomes possible to make the resulting thermal stress smaller whilst improving the heat radiating property.

Accordingly, it never occurs such a case that erroneous operation and peeling off of a gallium arsenic semiconductor are caused due to stress applied thereto, thus making it possible to obtain a wiring base substrate which is thermally stable and reliable.

In case the high heat conductive body consists of two or more layers which are integrally joined together, wherein the coefficients of thermal expansion of the layers simply varies in the direction from one of opposite side surfaces of the high heat conductive body to the other of the side surfaces, it can be interposed between the elements or parts of the different coefficients of thermal expansion to mitigate or reduce the thermal stress arising between the two elements or parts.

That is, the high heat conductive body can reduce or mitigate the stress resulting from the difference of thermal expansion between the elements or parts such as an insulation layer and an integrated circuit chip or a heat radiating fin. For example, in case the high heat conductive body and an insulation layer are fired at the same time or joined together by brazing or the high heat conductive body and an element such as an integrated circuit chip are joined together by brazing it becomes possible to join them more firmly.

Accordingly, in case of firing of joining parts or at the time of joining of an insulation layer or chip by brazing, the stress resulting from the difference of thermal expansion can be reduced or mitigated whilst in case the chip is heated in operation the thermal stress arising between the chip and the high heat conductive body can be reduced or mitigated, thus making it possible to increase the joining strength whilst attaining a good heat radiating property.

Further, even when a layer of a relatively low heat conductivity is arranged on the side of an element or part of a relatively large coefficient of thermal expansion, a layer having a large content of molybdenum or tungsten and of a high heat conductivity can be formed in the high heat conductive body so as to lie consecutively to the above described layer, thus making it possible to attain a high heat radiating property as a whole.

In the meantime, a stress arises in the above described two or more layers due to the difference in the inverse rate of shrinkage between the layers.

As will be described hereinlater, the variation of the inverse rate of shrinkage at the time of firing of the high heat conductive body differs largely depending on whether the high heat conductive body contains molybdenum or tungsten.

In case the inverse rate of shrinkage largely differs between two adjacent layers, there may occur such a case in which a large stress is caused at the joint between the layers due to the difference of shrinkage at the time of firing of the high heat conductive body. In case such a stress is large the connection of the layers is weakened, thus reducing the strength and the durability of the high heat conductive body and therefore making it impossible to attain a high heat conductive body having a high reliability.

In case all of the two or more layers constituting the high heat conductive body contain molybdenum or tungsten only or both molybdenum and tungsten at a constant rate, sudden change of the inverse rate of shrinkage does not occur between the layers, thus making it possible to reduce the stress arising between the layers.

Furthermore, the two or more layers can be produced by a raw material containing one of molybdenum and tungsten or molybdenum and tungsten mixed at a constant rate, so the control of the manufacturing process can be made easier.

Figure 2:
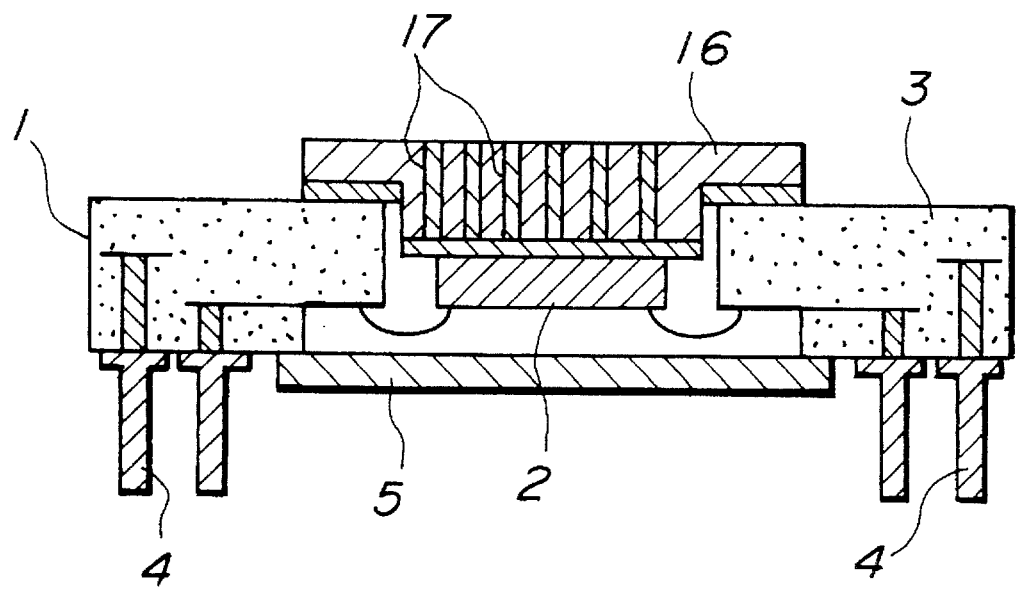
FIG. 2 is a view similar to FIG. 1 but shows another embodiment in which a high heat conductive body is provided with a plurality of heat transfer posts.

As shown in FIG. 2, in case the high heat conductive body 16 is provided with heat conductive posts 17 which penetrate therethrough between the main and rear surfaces thereof, the heat conductive posts 17 containing molybdenum or tungsten as a main component and having a higher heat conductivity than the high heat conductive body 16 radiate heat efficiently and operate as so-called thermal piers. In the meantime, the heat conductive posts are manufactured by the step of forming through holes by punching, which step is performed between the step of forming a green sheet from various powders and the step of laminating punched out green sheets or after the step of laminating the punched out green sheets in the manufacture of a high heat conductive body, and by the step of filling the through holes with a metalizing substance of molybdenum or tungsten.

The heat conductive posts formed in the above manner can radiate heat produced by the integrated circuit through a short path and with efficiency.

In the meantime, the heat conductive posts can be obtained by filling, after the firing of the high heat conductive body, the preformed through holes of the high heat conductive body with paste of silver or copper and then subjecting the paste to firing. In such a case, a further excellent high heat conductive body can be obtained by the effect of silver or copper having a good heat conductivity.

In case a wiring base substrate fitted with a high heat conductive body wherein at least a portion of the high heat conductive body is directly and integrally connected with an insulation layer, the high heat conductive body and the insulation layer are directly connected with each other without interposing therebetween a brazing metal or adhesive. Accordingly, the heat arising at the integrated circuit and conducted to the insulation layer can be radiated through a shortest path and rapidly.

Figure 3:
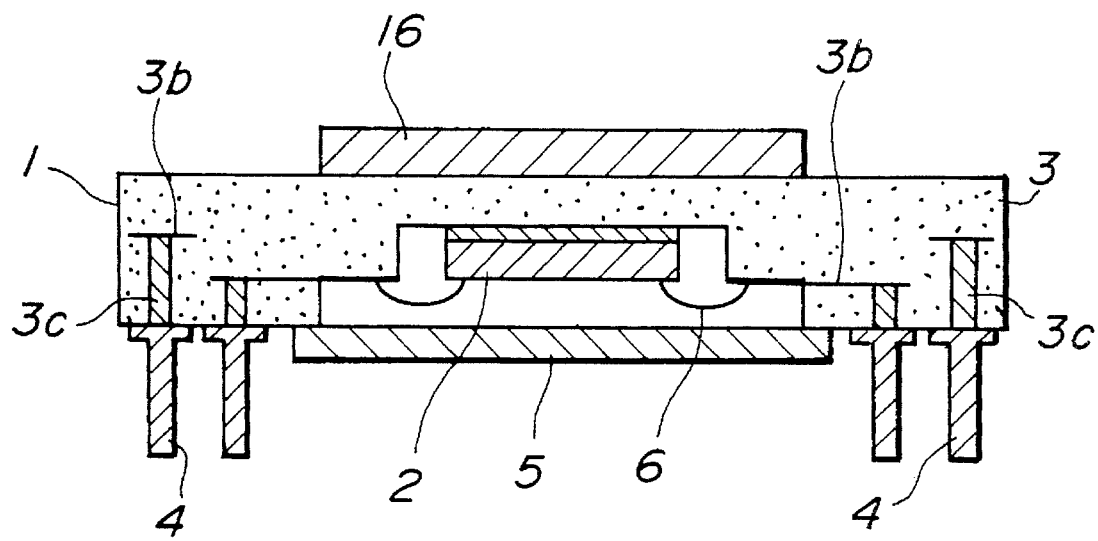
FIG. 3 is a view similar to FIG. 1 but shows a further embodiment in which a high heat conductive body and an insulation layer are integrally joined to constitute a ceramic base substrate.
Figure 4:
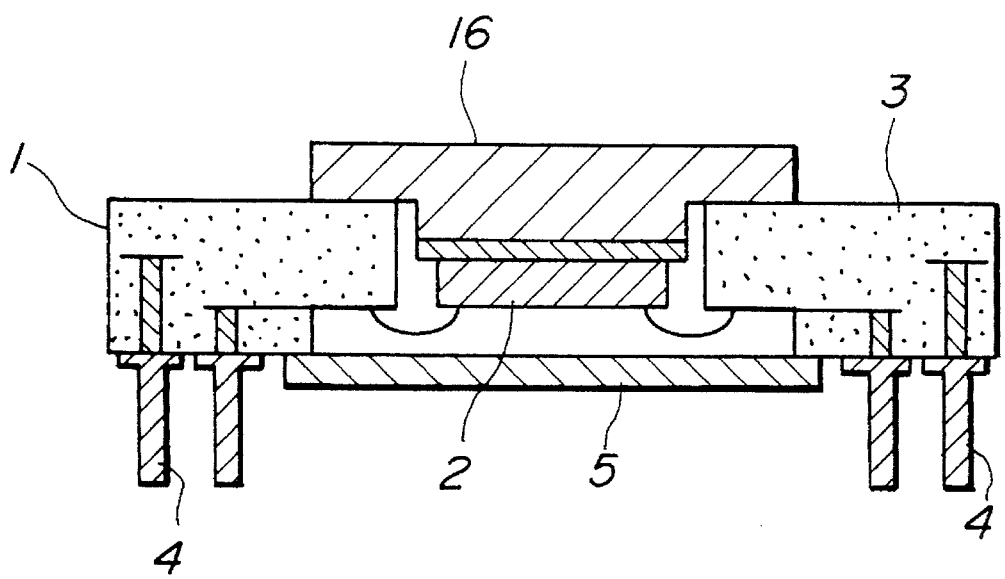
FIG. 4 is a view similar to FIG. 1 but shows a further embodiment in which a high heat conductive body is formed into a heat slug shape and connected integrally and directly to an insulation layer to constitute a ceramic substrate.

Further, since the high heat conductive body and the insulation layer are joined to constitute an integral unit, the thermal stress caused between the high heat conductive body and the insulation layer at the time of attachment and operation of the integrated circuit can be sustained more successfully as compared with a unit in which the both are joined by brazing (refer to FIGS. 3 and 4).

Figure 22:
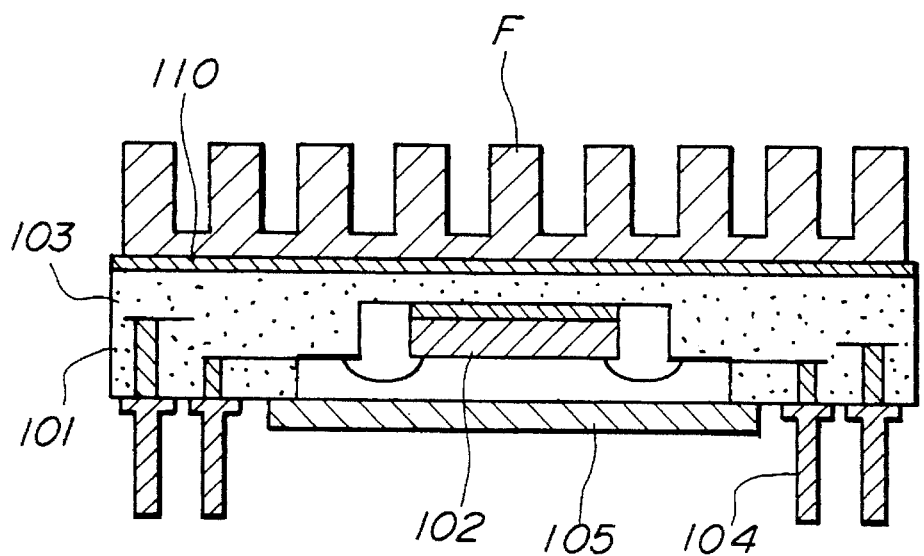
FIG. 22 is a sectional view of a prior art ceramic base substrate provided with a plurality of heat radiating fins.
Figure 23:
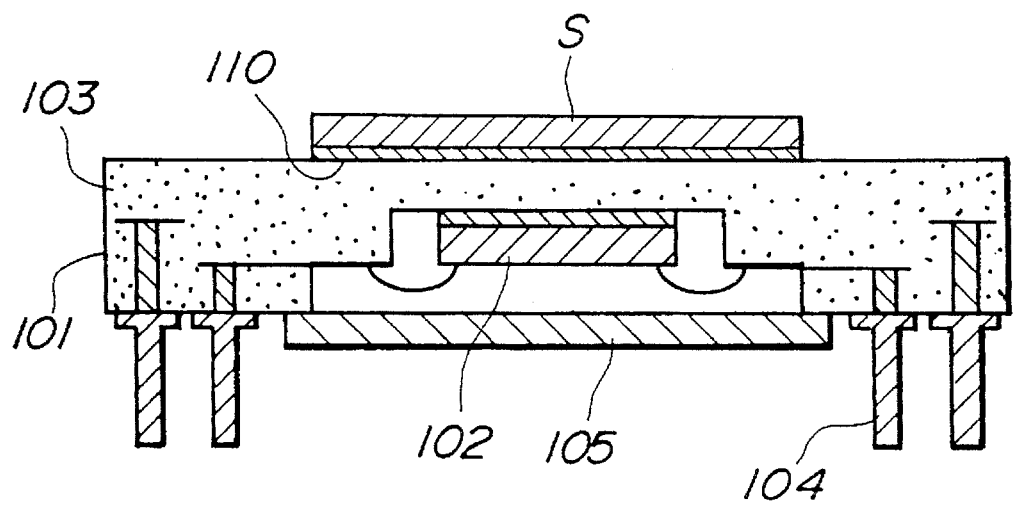
FIG. 23 is a sectional view of a prior art ceramic base substrate provided with a heat spreader.

Particularly, by forming, as shown in FIG. 4, the high heat conductive body 16 into the shape of heat slug for thereby integrating the same with the base substrate, deterioration of the air tightness otherwise caused at the brazed portion in case the high heat conductive body and the base substrate are joined by brazing as shown in FIGS. 1 and 22 can be prevented.

In this connection, in case the main component of the insulation layer is alumina and the main component of the ceramic in the high heat conductive body is alumina, the alumina components contained in the both are combined and integrated, thus making it possible to connect the insulation layer and the high heat conductive body more firmly. Accordingly, a wiring base substrate having a higher mechanical and thermal strength and a high reliability in connection between an insulation layer and a high heat conductive body fitted thereto.

Further, in case the insulation layer contains alumina as a main component and the ceramic in the high heat conductive body contains one of $SiO_2$, MgO and CaO, the glass component is diffused into the insulation layer and connected with the main component of alumina thereof for integration, so that the insulation layer and the high heat conductive body are joined together more firmly. Accordingly, a wiring base substrate having a higher mechanical and thermal strength and a higher reliability in connection between an insulation layer and a high heat conductive body fitted thereto is attained.

In case the insulation layer contains alumina as a main component and the high heat conductive body contains molybdenum and tungsten in a nearly equal amount, the inverse rate of shrinkage of the insulation layer is substantially equal to that of the high heat conductive body, thus making it possible to reduce the thermal stress resulting from the difference in the inverse rate of shrinkage between the insulation layer and the high heat conductive body and produce an effect for making the insulation layer and the high heat conductive body be joined more firmly.

In the meantime, in some case a wiring base substrate is required to be made thinner for attaining a higher packaging density. In such a case, the insulation layer is formed from thick film glass and therefore can be thinner as compared with the case the insulation layer is formed from a green sheet method. Further, since the insulation layer is thin, it can radiate heat more efficiently.

This is substantially the same in case polyimide is used for forming the insulation layer.

Further, in case polyimide is used, the dielectric constant of the insulation layer can be made lower than that of alumina ceramic, thus making it possible to reduce the skewness of the signal waveform in case the working frequency of the integrated circuit is high, thus making it possible to prevent an erroneous operation.

By a method of producing a high heat conductive body, comprising the steps of: preparing a mixture consisting of 30–99 wt. % of, when converted to metal, at least one of molybdenum, tungsten, molybdenum compound and tungsten compound and 1 or more wt. % of ceramic or of, when converted to ceramic after firing, a composition to be formed into ceramic after firing; forming a green sheet from the mixture; and punching the green sheet to form a punched out green sheet of a desired shape; and firing the punched out green sheet, a high heat conductive body can be obtained by a similar process for producing a conventional wiring base substrate made of alumina ceramic. Accordingly, there is no necessity of a difficult infiltration method used in case a heat radiating element is made of Cu-W and further there is no necessity of a difficult process of grinding, so that by an easy and efficient process of punching a sheet the high heat conductive body of a desired shape can be produced at a low cost.

Further, in order to produce a thick high heat conductive body, a plurality of punched out sheets for the high heat conductive body are laminated and thereafter fired. Such a method is usually used in the manufacture of a ceramic wiring base substrate and therefore the high heat conductive body can be produced at a low cost without requiring any particular apparatus or equipment.

In case a method of producing a wiring base substrate fitted with a high heat conductive body is characterized by the steps of: forming a green sheet from insulation ceramic or a composition to be formed into insulation ceramic after firing; punching the green sheet to form one or more punched out sheets of a desired shape for the wiring base substrate; laminating the one or more punched out sheets for the wiring base substrate and the one or more punched out sheets for the high heat conductive body; and firing the laminated sheets for the wiring base substrate and the high heat conductive body, a wiring base substrate fitted with a high heat conductive body and of the kind wherein an insulation layer and the high heat conductive body are directly and integrally connected to each other can be produced by a method similar to that for producing a conventional ceramic wiring base substrate. Accordingly, a process of forming a metalizing layer or electroplating layer used for the brazing of a heat radiating element to the wiring base substrate and a process of performing the brazing, which are conventionally necessitated in the manufacture of a wiring base substrate, can be omitted. That is, a wiring base substrate fitted with a high heat conductive body having a heat conductivity equated to that of a conventional heat radiating element can be produced by a process similar to that of producing a conventional ceramic wiring base substrate and at a low cost.

Particularly, in case the insulation ceramic or the composition to be formed into the insulation ceramic after firing, in the punched out green sheets for the wiring base substrate contains alumina as a main component and the ceramic or the composition to be formed into the ceramic after firing contains alumina as a main component, the alumina components in the insulation layer and the high heat conductive body are connected to each other by the firing of the both together or at the same time, and therefore the both are joined together firmly.

In the meantime, the firing temperature of molybdenum and tungsten and the firing temperature of alumina differ a little from each other, so that variations of the firing temperature cause variations of the joining condition of molybdenum,or tungsten and alumina, thus causing variations of the joining strength of the both.

In such a case, the alumina components in the insulation layer and the high heat conductive body are combined with each other to reduce the variations of the joining strength, so that variations of the joining strength of the both resulting from variations of the firing temperature in a manufacture process can be reduced, thus making it possible to manufacture a wiring base substrate having a high reliability.

A similar effect can be obtained in case the insulation ceramic or the composition to be formed into said insulation ceramic after firing, in the punched out green sheets for the wiring base substrate contains alumina as a main component and the ceramic or the composition to be formed into the ceramic after firing contains one of $SiO_2$, MgO and CaO. That is, $SiO_2$, MgO or CaO constituting a glass component is diffused into the insulation layer to be combined with the alumina component for thereby joining the insulation layer and the high heat conductive body integrally and firmly. Further, with respect to a variation of the firing temperature a resulting variation of the joining strength can be small similarly to that described as above, thus making it possible to attain a wiring base substrate having a stable performance characteristic.

Further, in case the insulation ceramic or the composition to be formed into the insulation ceramic after firing, in the punched out green sheets for the wiring base substrate contains alumina as a main component and the punched out green sheets for the high heat conductive body contains molybdenum and tungsten in a nearly equal amount when converted to metal, the stress resulting from the difference in the inverse rate of shrinkage between the insulation layer and the high heat conductive body can be reduced. That is, molybdenum, when mixed with alumina and fired, exhibits a tendency of increasing the inverse rate of shrinkage. On the other hand, tungsten, when mixed with alumina and fired, exhibits a tendency of decreasing the inverse rate of shrinkage, which tendency is thus opposite to that of molybdenum. Accordingly, by mixing molybdenum and tungsten in an nearly equal amount with alumina and firing the mixture, the inverse rate of shrinkage can be made nearly equal to that of the insulation layer which does not contain molybdenum or tungsten but alumina as a main component, so that the stress resulting from the difference in the inverse rate of shrinkage between the both can be reduced and therefore the insulation layer and the high heat conductive body can be joined together more firmly.

In the meantime, in case the sum of the contents of molybdenum and tungsten in the high heat conductive body is smaller than 30 wt. %, the resulting heat conductivity is not sufficiently large and furthermore a sufficiently large influence to the coefficient of thermal expansion and the inverse rate of shrinkage cannot be obtained, so that such an effect as desired by this invention cannot be obtained.

On the other hand, in case the content of molybdenum in the high heat conductive body exceed 99 wt. %, due to the difference in the firing temperature between alumina and molybdenum or tungsten, sufficient firing cannot be attained at the firing temperature of alumina ceramic. Accordingly, when the firing is made at the temperature similar to the firing temperature of ceramic, an undesired result that the heat conductivity is lowered is obtained.

In such a case, if the high heat conductive body is alone fired at the temperature different from the firing temperature of ceramic, the process for firing ceramic cannot be used and another equipment is required, thus increasing the cost.

On the other hand, since the content of ceramic in the high heat conductive body is small, firing of the high heat conductive body together with the heat insulation layer cannot attain a desired result that the content of ceramic in the high heat conductive body and the ceramic content in the insulation layer are combined with each other, the glass component in the high heat conductive body is diffused into the insulation layer to be combined therewith and the glass component in the insulation layer is diffused into the high heat conductive body to be combined therewith.

Further, since the joining strength of the insulation layer and the high heat conductive body is largely varies in response to a variation of the firing temperature, a wiring base substrate of a stable property cannot be obtained.

EXAMPLE I

Ceramic powder is prepared by mixing 80 wt. % alumina powder and 20 wt. % in total of $SiO_2$ powder, MgO powder and CaO powder to be formed into a glass component. This ceramic powder is mixed with molybdenum powder and formed into a green sheet of the thickness of 0.6 mm by a doctor blade method. Thereafter, the green sheet is punched out to form punched out sheets of a predetermined size. Four punched out sheets are laminated and joined together by compression and then cut to a square flat plate having dimensions of about 40 mm×30 mm×2.4 mm. The square flat plate is then fired in the reducing atmosphere at the temperature of about 1,500° C. and thereby formed into a sample for a high heat conductive body. With respect to this sample, measurements of the heat conductivity, thermal expansion coefficient, electric conductivity and inverse rate of shrinkage were made. The result of measurement is shown in Table I and in FIGS. 5 to 8.

In the Table and Figures, the mixing amount of molybdenum is represented by the weight percentage of the mixing amount of molybdenum relative to the total amount of ceramic powder and molybdenum powder. This is similarly used in Tables II to IV and in FIGS. 9 to 12. In the meantime, a glass component such as alumina and $SiO_2$, molybdenum and tungsten do not vary in weight before and after firing of the high heat conductive body, so the weight percentages in the Tables and Figures represent the weight percentages of the contents of molybdenum, etc. in the high heat conductive body after firing.

TABLE I

| Mixing Amount of Molybdenum wt. % | Heat Conductivity W/m · °C. | Coefficient of Thermal Expansion × 10⁻⁶/°C. | Conductivity mho/cm | Inverse Rate of Shrinkage |
|---|---|---|---|---|
| 0 | 17 | 6.7 | >$10^{-12}$ | 1.200 |
| 20 | 18 | 6.6 | $10^{-10}$ | 1.212 |
| 30 | 22 | 6.5 | 1.2 | 1.228 |
| 68 | 51 | 6.1 | $2.8 \times 10^3$ | 1.259 |
| 94 | 108 | 5.6 | $5 \times 10^4$ | 1.294 |
| 99 | 105 | 5.6 | $2 \times 10^5$ | 1.280 |

Figure 5:
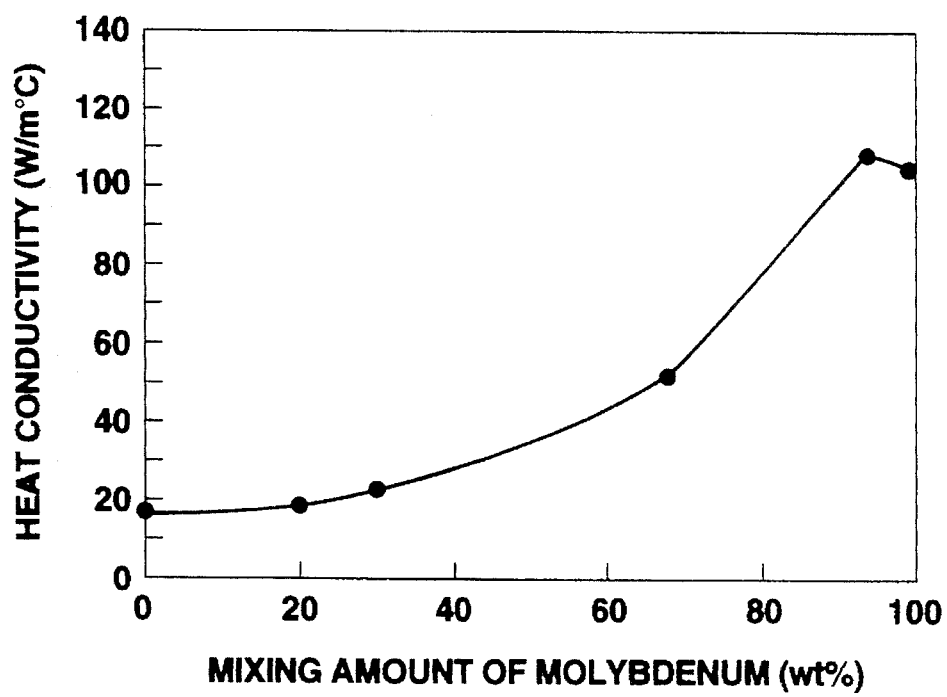
FIG. 5 is a graph showing the relation between a mixing amount of molybdenum in a high heat conductive body and a heat conductivity according to an example I.
Figure 6:
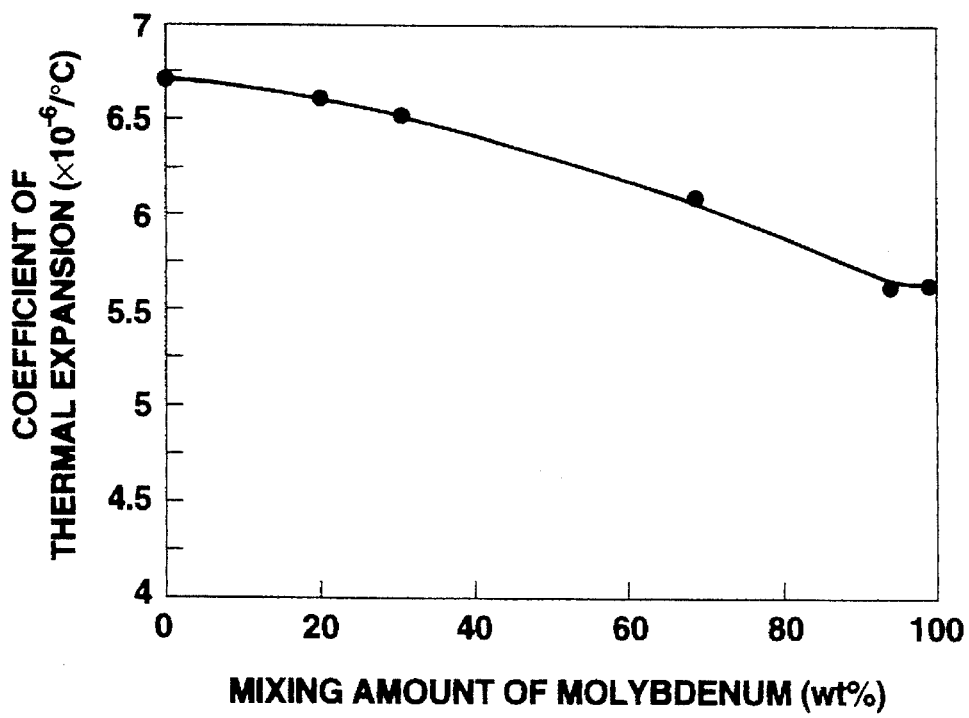
FIG. 6 is a graph showing the relation between a mixing amount of molybdenum in a high heat conductive body and coefficient thermal expansion according to the example I.

From those results, it will be seen that when the mixing amount of molybdenum becomes equal to or larger than 30 wt. % the heat conductivity increases whilst on the contrary the coefficient of thermal expansion decreases with increase of the mixing amount of molybdenum (refer to FIGS. 5 and 6).

Accordingly, by the use of the material for such a high heat conductive body a heat radiating element having a high heat conductivity and a small coefficient of thermal expansion can be produced by the same process for producing ceramic from alumina, or the like.

Figure 7:
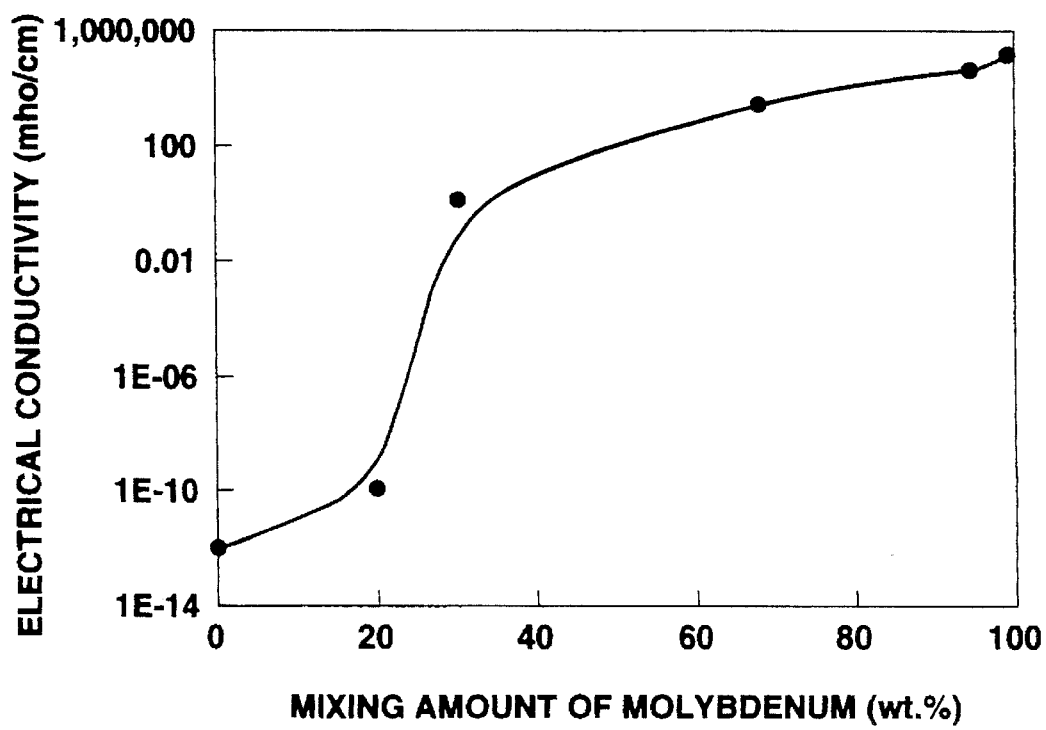
FIG. 7 is a graph showing the relation between a mixing amount of molybdenum in a high heat conductive body and an electric conductivity according to the example I.

Further, as the content of molybdenum increases the high heat conductive body comes to possess an increasing electric conductivity (refer to FIG. 7). The above described sample for a high heat conductive body was subjected to electroplating so as to test for whether an electroplating layer can be formed on the surface of the high heat conductive body. The test result is shown in Table II.

TABLE II

| Mixing Amount of Molybdenum wt. % | Ni plating |
|---|---|
| 0 | *NO |
| 20 | NO |
| 30 | *YES |
| 68 | YES |
| 94 | YES |
| 99 | YES |

*"NO" means that Ni plating cannot be formed.
*"YES" means that Ni plating can be formed.

From the Table II, in case the content of molybdenum is equal to more than 30 wt. %, the high heat conductive body possesses such an electric conductivity that enables to form, by an electroplating process, a plating layer thereon. Accordingly, by forming a heat radiating element from such a high heat conductive body, the radiating element can be coated with a plating layer directly by an electroplating process similarly to a heat radiating element made of a Cu-W alloy, so it can be dispensed with such a metalized layer that is otherwise necessitated in case of AlN (aluminum nitride) and that is formed by baking of a thick film of metallic paste thereon.

In the meantime, when the mixing amount of molybdenum increases up to 99 wt. %, there occurs a change that the heat conductivity becomes lower a little whilst on the contrary the coefficient of thermal expansion becomes higher a little. This change is considered as resulting from insufficient sintering due to the difference in the sintering temperature between alumina and molybdenum.

From the foregoing, it will be understood that the content of molybdenum from 30 wt. % to 99 wt. % is suitable. Specifically, the content equal to or lower than 97 wt. % is more suitable. It is considered that the content of ceramic component of 3 wt. % or so is effective for attaining sufficient joining.

In the meantime, in case the content of molybdenum is from 60 wt. % to 99 wt. %, a high heat conductivity is attained, so when the high heat conductive body is used as a heat radiating element an excellent heat radiating property can be obtained. In this instance, the coefficient of thermal expansion is low and close to that of a silicon semiconductor, so when the high heat conductive body is attached with an integrated circuit consisting of silicon semiconductors a high heat conductivity can be enjoyed and further the thermal stress caused in the silicon semiconductor at the time of fixing and operation thereof can be reduced, thus improving the reliability of the integrated circuit.

On the other hand, in case the content of molybdenum is from 30 wt. % to 60 wt. %, the heat conductivity is relatively small and the heat radiating property is relatively poor for a heat radiating element. However, since the coefficient of thermal expansion is relatively high, it becomes possible, in case the high heat conductive body is attached with a ceramic element containing alumina as a main component or in case the high heat conductive body is attached with an integrated circuit consisting of gallium arsenide semiconductors, the thermal stresses arising in the ceramic element or the integrated circuit can be reduced for thereby making it possible to improve the reliability of the ceramic base substrate or the integrated circuit. Further, the high heat conductive body of this invention can also be used in case a required heat radiating property is not so high. In this instance, the necessitated amount of molybdenum which is expensive as compared with alumina or the like can be smaller, thus making it possible to manufacture the heat conductive body at a low cost.

In the meantime, in case the mixing amount of molybdenum is smaller than 30 wt. %, the heat conductivity is not high. It is considered that when the mixing amount of molybdenum is small alumina exists between molybdenum components so the heat conductivity is affected by that of alumina. This mixing amount of molybdenum is thus not suitable for obtaining the high heat conductive body of this invention.

Further, in case the content of molybdenum is smaller than 30 wt. %, the coefficient of thermal expansion is not lowered. This content of molybdenum is thus not effective for reducing the thermal stress in cooperation with an associated member such as an integrated circuit, etc. Further, the electric conductivity increases sharply when the content of molybdenum is between 20 wt. % and 30 wt. %, so electroplating cannot be attained when the content of molybdenum is equal to or smaller than 30 wt. %.

On the other hand, when the content of molybdenum exceeds 99 wt. %, the sintering temperature of ceramic having alumina as a main component and the sintering temperature of molybdenum are different from each other, whereby sufficient sintering cannot be attained and the thermal conductivity is lowered. This content of molybdenum is thus not desired for the high heat conductive body.

In the meantime, in the production of the above described high heat conductive body, in case the thickness of a desired high heat conductive body is thin a single punched out green sheet is fired, without being laminated with another punched out green sheet.

Further, by laminating green sheets after punching out and then firing a laminated assembly of sheets, a high heat conductive body of a desired shape can be obtained. Further, before or after firing the shape of the high heat conductive body can be easily adjusted by grinding, or the like.

Accordingly, a process of difficult cutting, etc. in case of a Cu-W alloy can be eliminated, and a process for producing a ceramic base substrate for integrated circuit packaging can be used to produce the high heat conductive body, thus making it possible to supply the high heat conductive for use as a heat radiating element at a low cost.

This is similarly applicable in the following examples II to IV.

In this instance, a doctor blade method is by way of example shown as a method for producing a green sheet but is not for the purpose of limitation, and another forming method such as pressing, paste method, etc. can be used so long as wiring and lamination can be made after the material is formed into a predetermined shape.

EXAMPLE II

In place of molybdenum powder in the previous example I, tungsten power is used to produce a sample of a high heat conductive body by the similar processes employed in the example I. With respect to this example, measurements of the heat conductivity, coefficient of thermal expansion, heat conductivity and the inverse rate of shrinkage were made. The result is shown in Table III and in FIGS. 9 to 12.

TABLE III

| Mixing Amount of Tungsten wt. % | Heat Conductivity W/m · °C. | Coefficient of Thermal Expansion × 10⁻⁶/°C. | Conductivity mho/cm | Inverse Rate of Shrinkage |
|---|---|---|---|---|
| 0 | 17 | 6.7 | >10⁻¹² | 1.200 |
| 20 | 18 | 6.6 | 10⁻¹⁰ | 1.198 |
| 30 | 22 | 6.5 | 1.1 | 1.195 |
| 78 | 48 | 5.7 | 8.5 × 10³ | 1.158 |
| 99 | 108 | 4.8 | 9 × 10⁴ | 1.002 |

From those Table and Figures, it will be seen that the heat conductivity increases whilst the coefficient of thermal expansion decreases with increase of the content of tungsten similarly to the previous example in which molybdenum is used.

Accordingly, similarly to the case where molybdenum is used, a heat radiating element having a high heat conductivity and a small coefficient of thermal expansion can be obtained by using this high heat conductive body and by the same process for producing a ceramic article consisting of alumina, or the like.

Further, regarding the electric conductivity, the high heat conductive body of this example, as shown in Table IV, has a similar electric conductivity to the previous example in which molybdenum is used, thus making it possible to form a plating layer by electroplating.

TABLE IV

| Mixing Amount of Tungsten wt. % | Ni plating |
|---|---|
| 0 | *NO |
| 20 | NO |
| 30 | *YES |
| 78 | YES |
| 99 | YES |

*"NO" means that Ni plating cannot be obtained.
*"YES" means that Ni plating can be obtained.

EXAMPLE III

In this example, molybdenum oxide powder is used in place of molybdenum powder to produce a high heat conductive body by using the same process as the previous example I. With respect to this example, measurements of the heat conductivity and the thermal expansion efficiency were made. The result is shown in Table V and in FIGS. 13 and 14.

From the result, it will be seen that the heat conductivity increases whilst the thermal expansion efficiency decreases with increase of the mixing amount of molybdenum oxide powder similarly to the example I in which molybdenum powder is used.

TABLE V

| Mixing Amount of Molybdenum Oxide wt. % | Amount converted to Mo | Heat Conductivity W/m · °C. | Coefficient of Thermal Expansion × 10⁻⁶/°C. |
|---|---|---|---|
| 0 | 0 | 17 | 6.7 |
| 30 | 22 | 18 | 6.6 |
| 50 | 40 | 21 | 6.5 |
| 70 | 61 | 28 | 6.2 |
| 88 | 83 | 50 | 6.0 |
| 99 | 98 | 106 | 5.7 |

In the meantime, molybdenum oxide exists actually as metallic molybdenum in the high heat conductive body since it is fired in the reducing atmosphere and reduced. This was recognized by a multiple crystal method and EPMA analysis.

Figure 13:
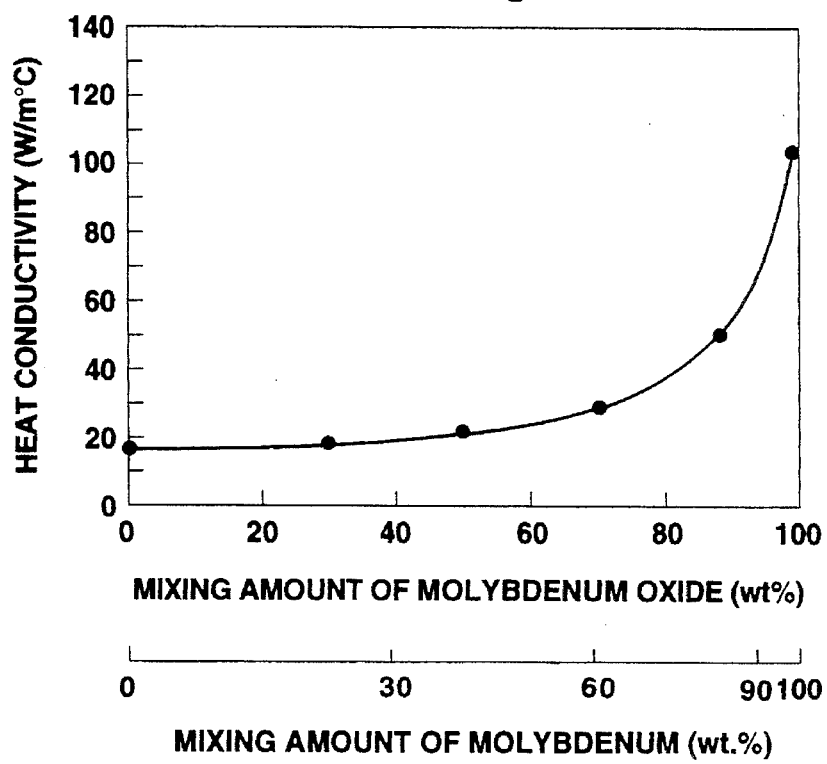
FIG. 13 is a graph showing the relation between a mixing amount of molybdenum oxide in a high heat conductive body and a heat conductivity according to an example III.
Figure 14:
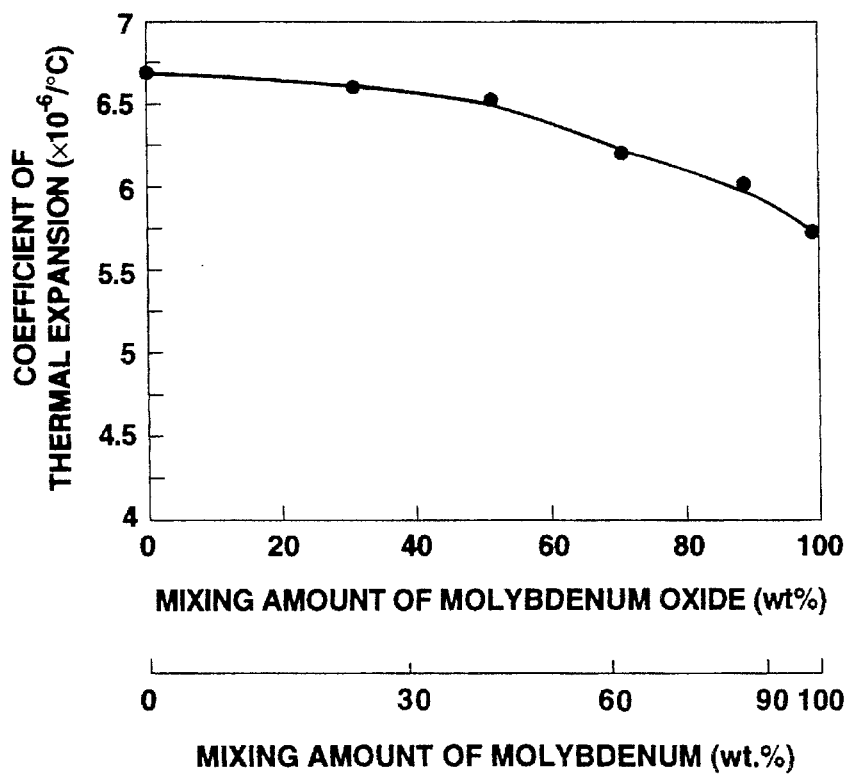
FIG. 14 is a graph showing the relation between a mixing amount of molybdenum oxide in a high heat conductive body and coefficient of thermal expansion according to the example III.

Thus, in FIGS. 13 and 14, the reduced content of molybdenum is also shown in the axis of abscissa. In the meantime, since molybdenum oxide actually used is molybdenum trioxide, conversion of molybdenum oxide to molybdenum was made on the assumption that all of molybdenum trioxide was reduced to molybdenum.

However, in the above described analyzing means, the impurity of the amount smaller than several percentages (e.g., 3%) is not detected, so there is a possibility that molybdenum oxide which is not yet reacted and of the amount smaller than several percentages exists. Such a small amount of non-reactive molybdenum oxide is considered not to cause any substantial influence to its characteristics of the high heat conductive body of this invention.

From the foregoing, it will be understood that this example in which molybdenum oxide powder is used can produce substantially the same effect as the examples I and II. Accordingly, the high heat conductive body of this example can be used as a heat radiating element similarly to the previous examples.

EXAMPLE IV

In place of tungsten powder utilized in the previous example II, tungsten oxide powder is used to produce a sample for a high heat conductive body. With respect to this sample, measurements of the heat conductivity and the coefficient of thermal expansion were made. The test result is shown in Table VI and in the FIGS. 15 and 16.

From this result, it will be seen that, similarly to the example II in which tungsten powder is used, the heat conductivity increases whilst the thermal expansion efficiency decreases with increase of the mixing amount of tungsten oxide powder.

In the meantime, tungsten oxide is reduced in the reducing atmosphere and thus actually exists as metallic tungsten within the high heat conductive body. This was recognized by a multiple crystal method and EPMA analysis.

TABLE VI

| Mixing Amount of Tungsten Oxide wt. % | Amount converted to W | Heat Conductivity W/m · °C. | Coefficient of Thermal Expansion × $10^{-6}$/°C. |
|---|---|---|---|
| 0 | 0 | 17 | 6.7 |
| 30 | 25 | 19 | 6.6 |
| 60 | 54 | 24 | 6.4 |
| 90 | 88 | 51 | 5.8 |
| 99 | 99 | 108 | 5.5 |

Figure 15:
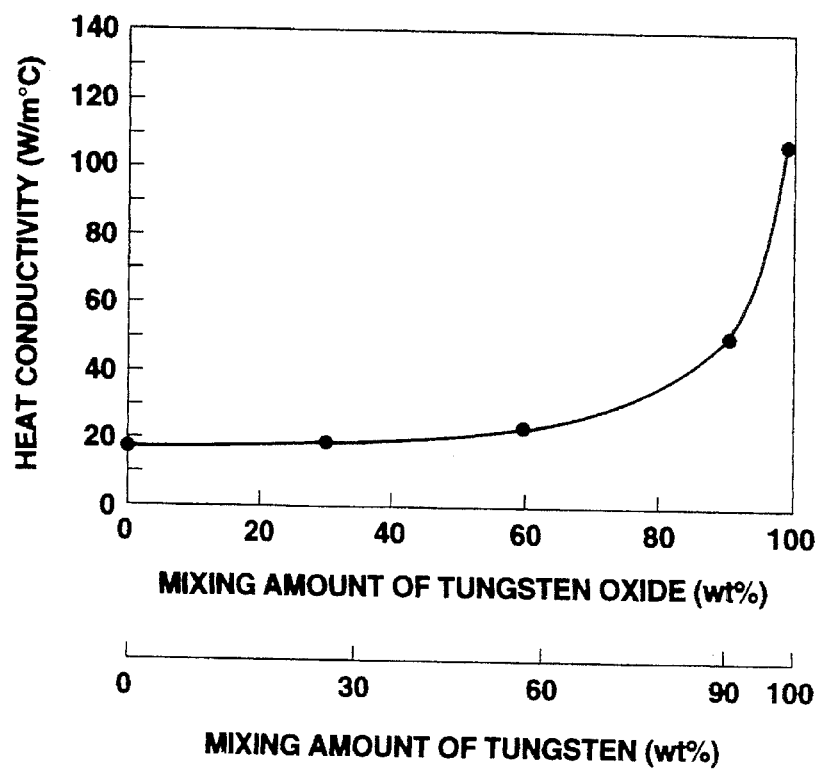
FIG. 15 is a graph showing the relation between a mixing amount of molybdenum oxide in a high heat conductive body and heat conductivity according to an example IV.
Figure 16:
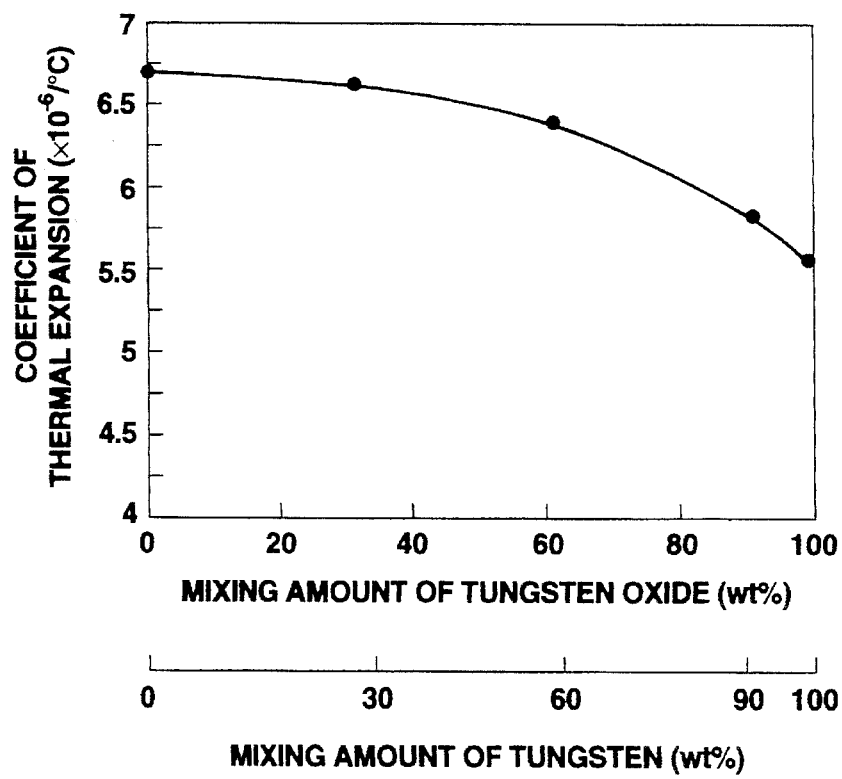
FIG. 16 is a graph showing the relation between a mixing amount of tungsten oxide in a high heat conductive body and coefficient of thermal expansion according to the example IV.

Thus, in FIGS. 15 and 16, the reduced content of tungsten is also shown in the axis of abscissa. In the meantime, since tungsten oxide actually used is tungsten trioxide, conversion of tungsten oxide to tungsten was made on the assumption that all of tungsten trioxide was reduce to tungsten.

However, by the above described analyzing means, the impurity of the amount smaller than several percentages (e.g., 3%) is not detected, so there is a possibility that molybdenum oxide which is not yet reacted and of the amount smaller than several percentages exists. Such a small amount of non-reactive tungsten oxide is considered not to cause any substantial influence to its characteristics of the high heat conductive body of this invention.

From the foregoing, it will be understood that this example using tungsten oxide powder can produce substantially the same effect as the examples I and II. Accordingly, the high heat conductive body of this example can be used as a heat radiating element similarly to the previous examples.

Further, from the results of the previous examples I to IV, it will be understood that when a high heat conductive body having a high heat conductivity can be obtained when it contains 30–99 wt. % at least one of molybdenum and tungsten and 1 or more wt. % ceramic.

It will further be apparent that by forming a green sheet from a mixture containing 30–99 wt. % of, when converted to metal, at least one of molybdenum, tungsten, molybdenum compound and tungsten compound and 1 or more wt. % of ceramic or of, when converted to ceramic, a composition to be formed into ceramics after firing, and by punching out the green sheet to form a punched out sheet of a desired shape for a high heat conductive body, and then firing the punched out sheet, a high heat conductive body can be obtained at a low cost.

In this instance, while in the above described examples I to IV alumina is used as a ceramic material, mullite can be used in place therefor to make higher the heat conductivity and give an electric conductivity to the ceramic article obtained.

However, the coefficient of thermal expansion of mullite is 4.0×$10^{-6}$/°C. and thus smaller than that of molybdenum or tungsten, so when molybdenum or tungsten is mixed the coefficient of thermal expansion increases reversely to the case of alumina. Accordingly, in the range in which the content of molybdenum or tungsten is relatively small (30–60 wt. %) the coefficient of thermal expansion of ceramic approximates to that of a silicon semiconductor chip whilst in the range in which the content of molybdenum is relative large (60–99wt. %) it approximates to that of gallium arsenide semiconductor chip, thus being capable of reducing the thermal stress which will be caused at the joint between the semiconductor chip and the high heat conductive body.

EXAMPLE V

A sample for the high heat conductive body is produced by preparing a plurality of green sheets by varying the mixing amount of molybdenum powder and laminating the sheets in the order of the content of molybdenum and firing a laminated assembly of sheets.

Such a high heat conductive body, as seen from tables I to VI, varies in coefficient of thermal expansion in the direction from one side surface to the other, so if interposed between two elements of different coefficients of thermal expansion, e.g., between a ceramic base substrate containing alumina as a main component and a silicon semiconductor integrated circuit it can mitigate or reduce the thermal stress caused at the joint between the substrate and the integrated circuit.

Figure 17:
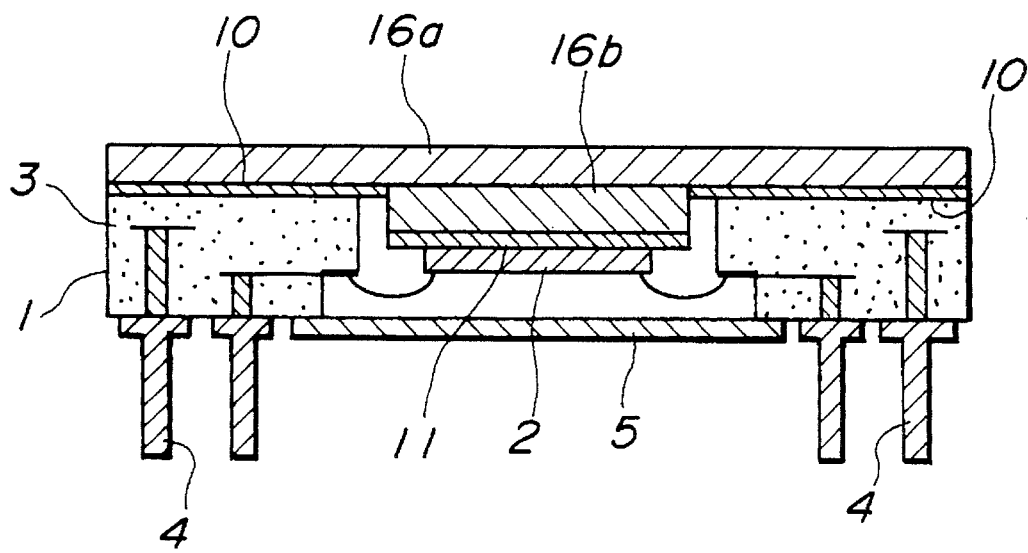
FIG. 17 is a view similar to FIG. 1 but shows a further embodiment in which a high heat conductive body is formed from two sheets of different compositions by laminating and firing and is attached to a ceramic base substrate to serve as a heat radiating element.

That is, as shown in FIG. 17, by attaching to the layer 16a of small content of molybdenum a ceramic substrate 3 having a high coefficient of thermal expansion by means of silver solder 10 and by attaching to the layer 16b of large content of molybdenum a silicon semiconductor integrated circuit 2 by means of gold solder 11, the thermal stress caused at the time of the attaching of the integrated circuit 2 and at the time of operation thereof can be reduced or mitigated as compared with the case in which the silicon semiconductor integrated circuit 2 is directly attached to the alumina ceramic substrate 1 whilst heat radiation becomes easier, thus making it possible to prevent peeling off, erroneous operation and breakage of the integrated circuit 2.

The same effect can be obtained in case the mixing amount of tungsten powder in the example II is varied to produce green sheets for the high heat conductive body, which green sheets are laminated in the order of the content of tungsten and fired to obtain a high heat conductive body.

Further, it will be apparent that the above modification can be applied to the examples III and IV in which molybdenum oxide and tungsten oxide are used.

In this instance, the example in which the high heat conductive body is formed from two kinds of layers was tested for comparison with the example in which the high heat conductive body is formed from a single kind of layer. A green sheet is formed from a mixture of 2 wt. % alumina powder, 2 wt. % in total of $SiO_2$, MgO and CaO and 96 wt. % molybdenum powder by a doctor blade method and punched out to produce a sheet "A". Similarly, a sheet "B" is formed from a mixture of 51 wt. % alumina powder, 4 wt. % in total of $SiO_2$, MgO and CaO and 45 wt. % molybdenum powder.

The sheets "A" and "B" are laminated and cut to have dimensions of 32 mm×32 mm×1.0 mm and fired to manufacture a sample high heat conductive body "a" consisting of two layers.

In the similar manner, two sheets "A" are laminated and cut to manufacture a comparative sample "b".

Then, ceramic substrates having the dimensions of 55 mm×55 mm×2.4 mm and of the content of 80 wt % of alumina are joined by means of silver solder to the side of the sheet "B" in case of the sample "a" and to either of the sides in case of the sample "b", respectively. In the meantime, prior to the joining, the joining surfaces of the samples "a" and "b" are formed with a Ni layer by means of electroplating, whilst the joining surface of the alumina ceramic substrate is formed with a thick tungsten base layer and a Ni plating layer thereon.

The above samples joined to the ceramic substrates was subjected to a thermal shock test (MIL-STD-803C, Cond. C) by being exposed to the temperature between −65° C. and +150° C. repeatedly for 100 cycles and it was examined by a fluoroscopic flaw detection method whether a crack was caused at or adjacent the joining surfaces of the sample "a" or "b" and the ceramic substrate.

From the result it was disclosed that no crack was found in the sample "a" but a crack was found in the sample "b".

This is because in case of the sample "a" the content of molybdenum is small and therefore the coefficient of thermal expansion relatively approximates to that of the alumina ceramic substrate, so that the thermal stress caused in the both members was small.

On the other hand, in case of the sample "b" the content of molybdenum is large and therefore the coefficient of thermal expansion is large, so that the thermal stress caused at the joining portions of the sample and the ceramic substrate became large and it is considered that a crack was resultantly caused in the sample "b" which is relative low in strength.

From the foregoing, it will be understood that a thermal conductor consisting of at least two or more layers which are integrally joined together and the coefficients of thermal expansion of each layers varies simply in one direction from one surface of the high heat conductive body to the other, makes it possible to mitigate or reduce the thermal stress and attain an improved reliability.

Further, in the above experiments, both of the sheets "A" and "B" used to form the sample "a" are formed from a mixture of molybdenum powder and ceramic powder without containing tungsten powder. This is because, as seen from Table I, Table III, FIG. 8 and FIG. 12, the variation tendencies of the inverse rates of shrinkage of molybdenum and tungsten are opposite to each other. That is, in case a sheet "A" and a sheet formed not from molybdenum powder but from tungsten powder (hereinlater called a sheet "C") are laminated, the inverse rate of shrinkage differs largely between the two sheets "A" and "C" though the coefficients of thermal expansion vary simply in one direction, possibly causing stress at the joint between the layers to deteriorate the connection (adherence) of the layers.

Accordingly, in order to prevent sudden variation of the inverse rate of shrinkage between the layers and thereby further improve the reliability, it is desired that all of two or more layers do not contain tungsten but molybdenum and the contents of molybdenum of the two or more layers vary simply from one side surface to the other. This is similarly applicable to the case where molybdenum and tungsten are replaced by one another.

Further, in such a case, a raw material can be served if only one of molybdenum powder, tungsten powder and a composition such as molybdenum oxide is prepared, and also in manufacturing processes the control of the green sheets can be simplified to cause an advantage on the manufacturing process, resulting in that the high heat conductive body can be supplied at a low cost.

Further, by maintaining the ratio of molybdenum to tungsten at a constant value and making the contents of the both vary simply, the inverse rate of shrinkage does not vary suddenly between the layers, thus making it possible to attain the same effect. In this instance, by previously preparing a mixture of molybdenum powder and tungsten powder which are mixed at a constant rate and mixing it with ceramic powder, the raw material and the manufacturing process control can be made easier.

EXAMPLE VI

Similarly to the example I, various powders for the high heat conductive body are formed into a green sheet. After the green sheet is punched out to form punched out sheets of a desire shape, a perforating process for forming through holes in each punched out sheet and a filling process for filling molybdenum metallizing ink into the through holes are subsequently performed. Then, the punched out sheets are laminated, cut to size, and fired to produce a high heat conductive body 16 (refer to FIG. 2). In the meantime, in FIG. 2, the high heat conductive body 16 is shown in the state of being brazed to the ceramic layer 3 of the base substrate 1.

In this instance, the molybdenum content of the high heat conductive body 16 is 60 wt. %, the heat conductive posts 17 is sized to be 0.2 mm in diameter and 2 mm in length, and thirty posts 17 are provided per square centimeter.

Measurement of the heat conductivity of the high heat conductive body 16 from one side surface to the other between which the heat conductive posts 17 are extended was made. The result was that the heat conductivity was 56 W/m ° C. which is 1.3 times larger than that (43 W/m °C.) of the high heat conductive body which is not provided with the heat conductive posts 17. Thus, it was recognized that the heat conductivity was further improved and therefore it was revealed that the heat conductive posts can serve as so-called thermal piers to make it possible to obtain a further improved heat radiating property.

FIG. 3 shows a pig grit array (PGA) type ceramic substrate 1 in which a heat conductor 16 of this invention is integrally and directly connected to an insulating ceramic layer 3 of a multi-layer ceramic substrate 1.

The PGA type ceramic substrate 1 consists of a multi-layer of ceramic 3 having installed thereon an integrated circuit chip 2 and provided with a number of pad sections (not shown) which are arranged to elongate lengthwise and widthwise on the main surface thereof, a number of external metal terminal 4 such as input/output pins made of kovar or the like, joined to the pad sections of the ceramic layer 3, and a sealing cover 5 made of kovar or the like and joined to the ceramic substrate 1 at the position around an integrated circuit chip installing portion (i.e., a die attached portion) and above the same.

The ceramic substrate 1 is provided with a plurality of insulating ceramic layers 3 in the sheet form and made of alumina or the like, and a heat conductor 16 directly and integrally joined to the uppermost surface of the insulating ceramic layers 3. Various wiring patterns 3b made of a high melting point metal are formed between the insulating ceramic layers 3 and connected by bonding wires 6 to the integrated circuit chip 2 and by pier boles 3c to the external metal terminals 4.

The multi-layer substrate 1 is produced in the following manner.

That is, in the manner shown with respect to the example 1, a green sheet for a heat conductor is formed and punched out into a predetermined shape for thereby preparing a sheet for the heat conductor.

On the other hand, similarly to a usual alumina ceramic substrate, a mixture consisting of 80 wt. % alumina powder and 20 wt. % in total of $SiO_2$, MgO and CaO is prepared, and a green sheet for insulating ceramic layer is formed from the mixture by a doctor blade method. After the green sheet is punched out, a desired wiring pattern is printed on the punched out sheet by using metalizing paste of molybdenum or tungsten.

Further, those punched out sheets are laminated and cut to size and thereafter fired in the reducing atmosphere for thereby producing a multi-layer substrate having a plurality of insulation ceramic layers 3 and a high heat conductive body 16 and in which the high heat conductive body 16 and the insulation ceramic layer 3 are directly and integrally joined together.

As described above, the forming of both the insulation ceramic layer 3 and heat conductor 16 is made by a doctor blade method and the firing thereof is made in the reducing atmosphere after lamination. Accordingly, the printing of wiring pattern and the lamination can be done similarly to the multi-layer substrate produced by laminating only the green sheets for usual insulating ceramic layers. Furthermore, a multi-layer substrate having a high heat radiating property by the effect of the high heat conductive body can be produced with ease.

In this instance, while a doctor blade method is shown as a method for forming a green sheet for an insulation ceramic layer, it is not for the purpose of limitation but another method such as pressing and paste method can be used to produce the sheet so long as it enables the wiring and lamination after the forming of the green sheet of a predetermined shape.

The thus produced ceramic substrate 1, as shown in FIG. 3, has the insulation ceramic layer 3 and the high heat conductive body 16 which are integrally and directly connected to each other without interposing therebetween a connecting element or member such as a metalizing layer and brazing metal, thus making it possible to radiate the heat, which is transferred to the insulation ceramic layer, efficiently through a short path.

Figure 24:
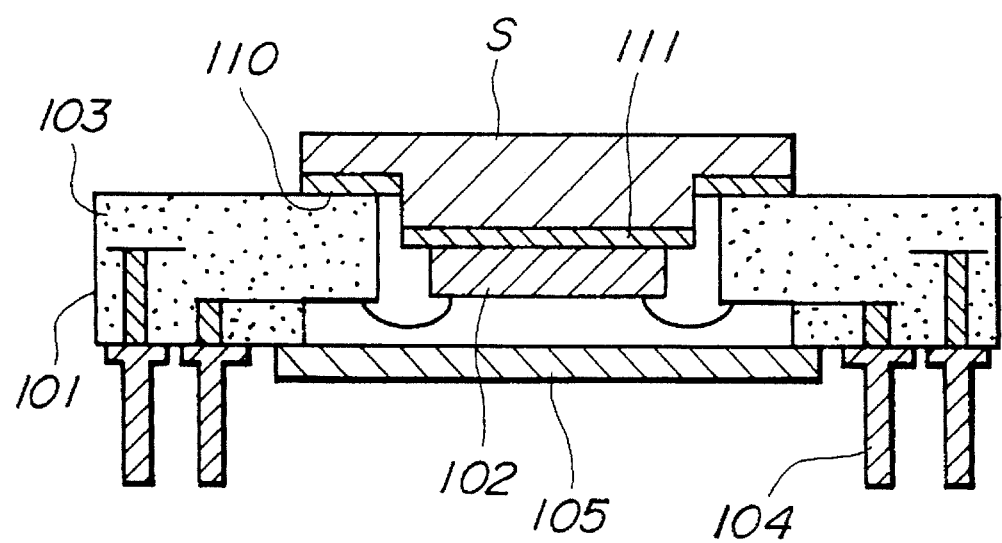
FIG. 24 is a sectional view of a prior art ceramic base substrate provided with a heat slug.

Further, in case, as shown in FIG. 4, the integrated circuit chip 2 is joined by a brazing metal to the high heat conductive body 16 without interposing therebetween the insulation ceramic layer 3, the ceramic substrate 1 can be produced in the same manner as that for producing the conventional ceramic substrate but can radiate heat efficiently as the ceramic substrate having the heat slug as shown in FIG. 24.

Accordingly, there is neither the necessity of the provision of the heat slug which is produced by using an expensive material nor the necessity of the forming of the metalized layer for the attachment of the heat slug. Furthermore, since the high heat conductive body 16 is firmly connected to the insulating ceramic layer 3, the more reliable air tightness as compared with the conventional brazing type is attained.

Figure 18:
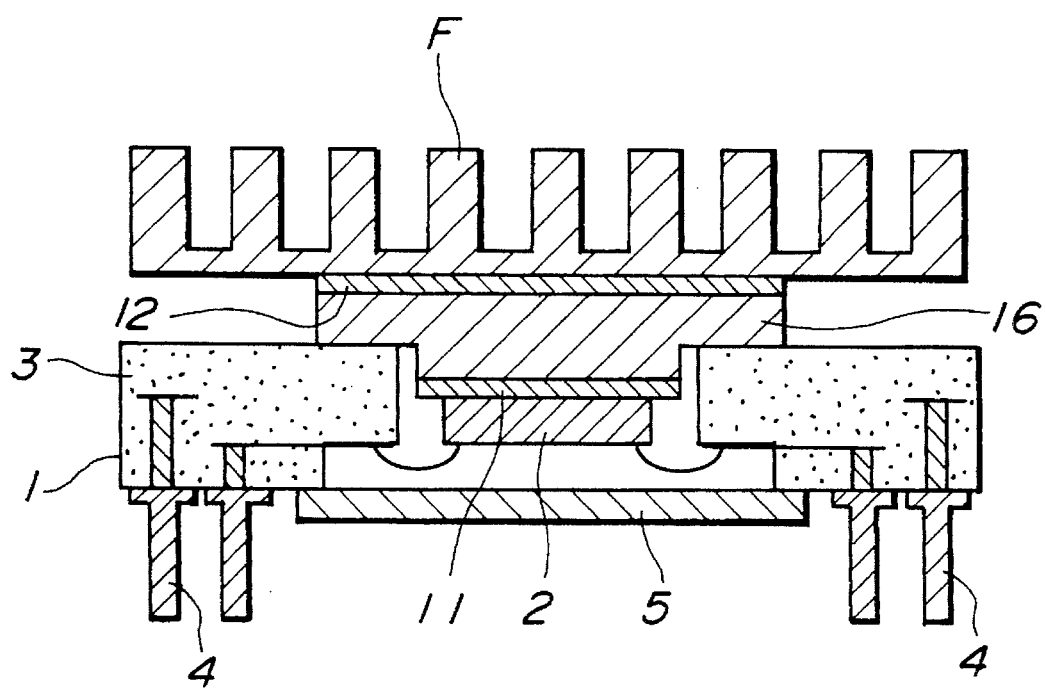
FIG. 18 is a view similar to FIG. 1 but shows a further embodiment in which a high heat conductive body is directly and integrally connected to an insulation layer to constitute a ceramic base substrate and has heat radiating fins attached thereto.

The high heat conductive body 16 has the electric conductivity and therefore can be directly applied with a plating layer. Accordingly, in case of the forming of the plating layer for the connection of the integrated circuit chip 2 or the heat radiating fin "F" as shown in FIG. 4 and 18, the high heat conductive body 16 can be directly formed with a Ni layer or Au layer by electroplating, so the integrated circuit chip 2 or the heat radiating fin can be joined thereon by brazing.

In this example, while the green sheet formed from molybdenum powder shown in the example I is used to produce the high heat conductive layer, a similar result can be obtained in case of the examples II to IV or in case a mixture of ceramic powder and one or more of molybdenum powder, tungsten powder and the compositions thereof is used to form a green sheet for a high heat conductive body.

In the meantime, while this example has been described and shown as being a PGA type multi-layer ceramic substrate, it may be of another type such as a ball grid array (BGA) type and side-brazed type, and the substrate is not necessarily of a multi-layer type but may be of a single layer type. Further, the integrated circuit can be plural in number, and a plurality of heat conductors may be connected to an insulating layer. Further, the heat conductor may be connected at the both sides to insulating layers.

EXAMPLE VIII

The joining strength of an insulating ceramic layer and a heat conductor was tested for by the manner which will be described hereinbelow with reference to Table VII and FIGS. 19–20.

In the first step, a green sheet is formed from a mixture of 99 wt. % tungsten powder, 1.0 wt. % alumina powder and an organic binder and is punched out to obtain a sheet "D". In a similar manner, a sheet "E" is formed from a mixture of 97 wt. % tungsten powder and 3 wt. % alumina powder.

On the other hand, a green sheet is similarly formed from a mixture of 92 wt. % alumina powder and 8 wt. % in total of a glass component of $SiO_2$, MgO and CaO to serve as sintering additives and similarly shaped and punched to obtain a sheet "F".

Then, the sheets "D", "E" and "F" are laminated and cut to produce samples "c" and "d" which are then fired in the reduction atmosphere and in three steps at the temperatures of 1500° C., 1550° C. and 1600° C. By providing Ni plating to the high heat conductive body side, a laminated substrate 30 consisting of heat conductor and insulating ceramic layers is produced.

On the other hand, a metal pin 34 having at an end a larger diameter flange is prepared, and a predetermined amount of Ag-Cu eutectic brazing metal is previously attached to the end face of the flange. And, the above described Ni-plating applied portion of the laminated substrate is joined with the pins by an Ag-Cu eutectic brazing metal at the furnace temperature of 900° C. and in the mixed of nitrogen-hydrogen.

Figure 19:
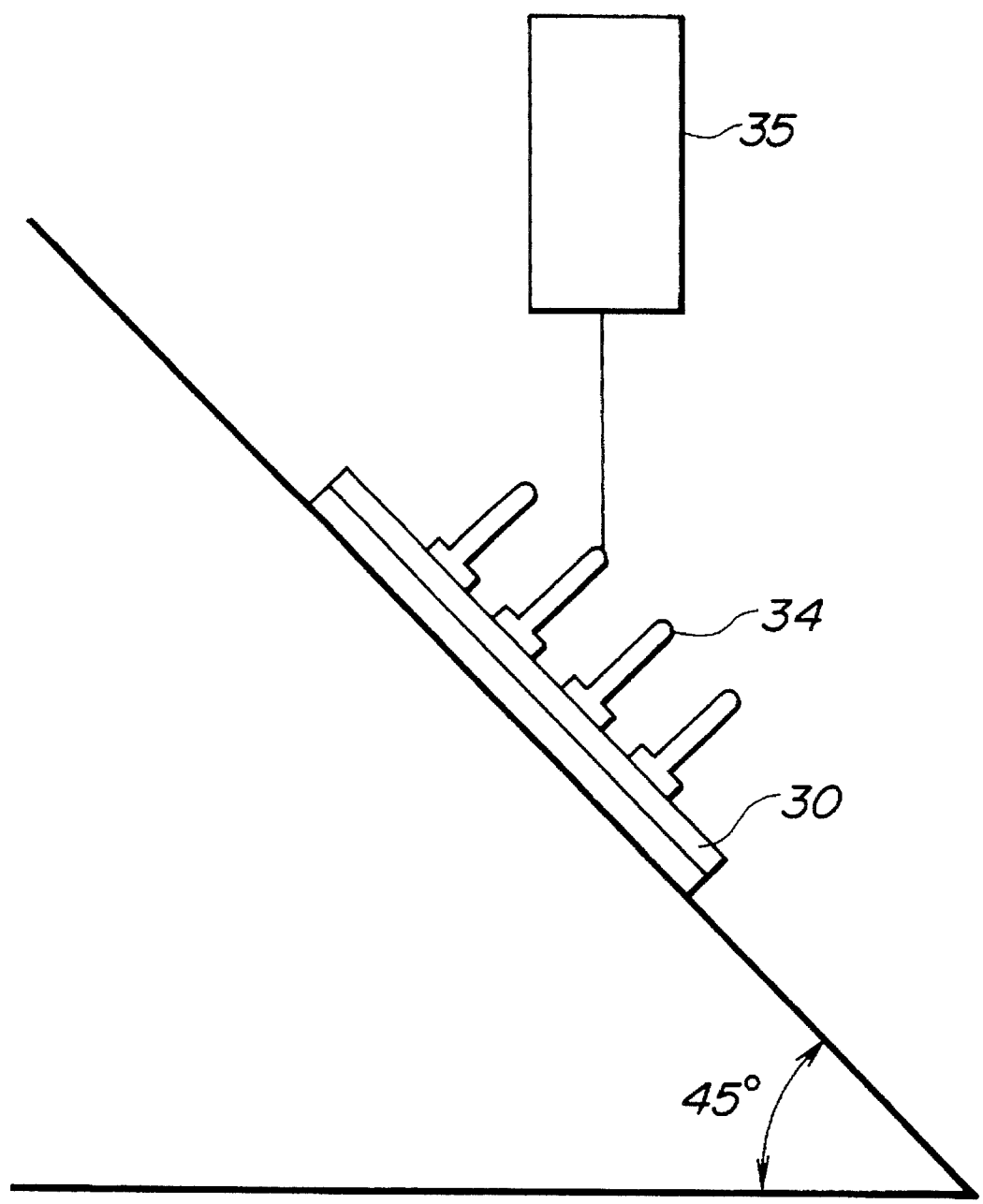
FIG. 19 is a schematic view for illustration of a method of testing a sample for the peeling strength.

After the joining, the end of one of the pins 34 is connected by a clamp and pulled in the direction forming an angle of 45° with the laminated substrate 34 as shown in FIG. 19 for thereby making measurement of the strength (hereinafter referred to as peeling strength).

For comparison, by using a sheet "G" which is prepared in a similar manner to the sheet "D" except for not containing alumina powder, a comparative laminated substrate (sample "e") is prepared and at the same time measurement of its peeling strength was made.

Figure 20:
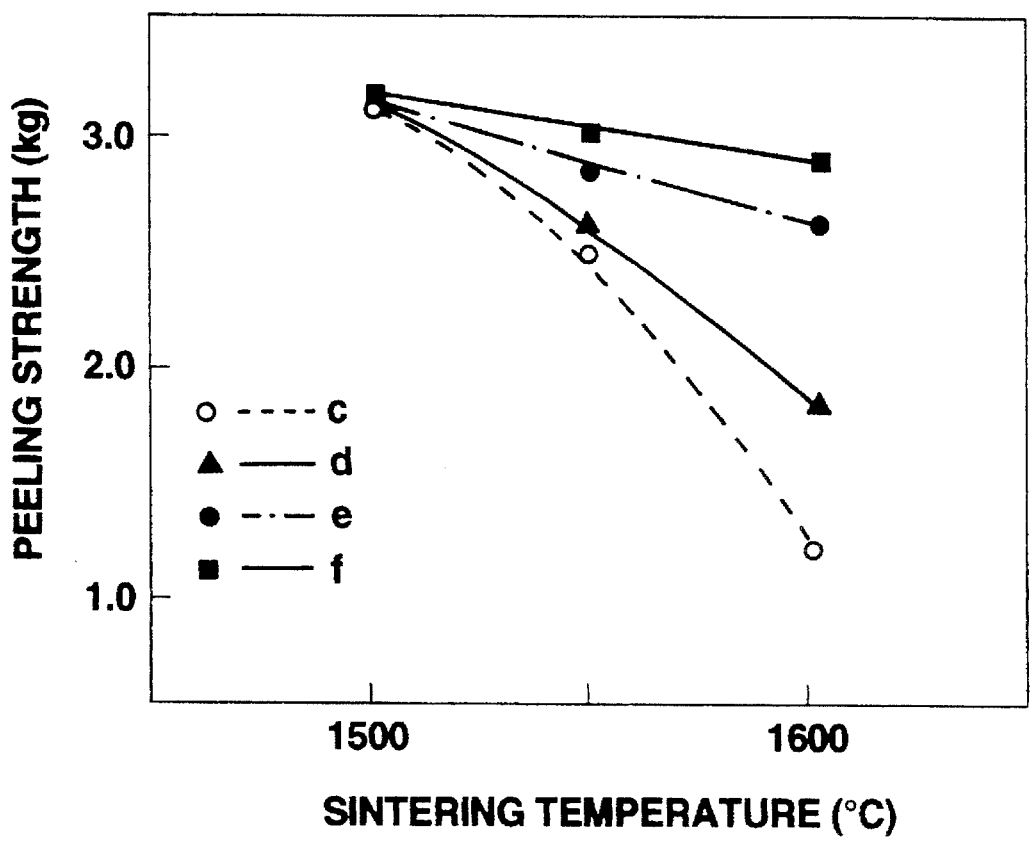
FIG. 20 is a graph for showing the result of test of the peeling strength.

The result of measurement of the peeling strength is shown in Table VII and in FIG. 20.

TABLE VII

| Sample | Peeling Strength | | |
|---|---|---|---|
| | 1500° C. | 1550° C. | 1600° C. |
| c | 3.13 | 2.50 | 1.23 |
| d | 3.12 | 2.65 | 1.85 |
| e | 3.12 | 2.79 | 2.64 |
| f | 3.17 | 3.03 | 2.92 |

As is apparent from FIG. 20, the peeling strength of the sample substrate of this invention does not differ from the comparative examples in case of the sintering temperature of 1500° C. but is higher than the samples "c" and "d" in case of either of the sintering temperatures of 1550° C. and 1600° C.

That is, it was revealed that the larger joining strength between the high heat conductive body and the insulating ceramic layer is obtained in case the high heat conductive body contains a small amount of ceramic having alumina as a main component than in case the high heat conductive body is formed from 100% tungsten. It is considered that this is because the alumina contained in the sheets "D" and "E" and the alumina contained in the sheet "F" are combined during sintering so that after sintering the high heat conductive body and the insulating ceramic layer are joined together firmly. Accordingly, the wiring base substrate can be higher in both mechanical and thermal strengths.

Further, in case of the sample "e", it was observed that the peeling strength is reduced considerably as the sintering temperature becomes higher. However, the samples "c", "d" of this invention, particularly the sample "d" is relatively stable in peeling strength, so even when the sintering temperature varies during manufacture the joining strength does not vary and thus a wiring base substrate can be made to vary a little in strength and have a high reliability.

EXAMPLE IX

In place of the sheets "D" and "E" of the above described example VIII, a sheet "H" formed from a mixture consisting of 97 wt. % tungsten powder, 1.0 wt. % alumina powder, 1.0 wt. % SiO$_2$ serving as a glass component, and 1.0 wt. % in total of MgO and CaO (0.5 wt % MgO and 0.5 wt. % CaO) is used to produce a wiring base plate (sample "f"). In connection with this example, measurement of a peel strength was made. The result is shown additionally in Table VII and FIG. 20.

From the result, it will be seen that addition of a glass component is effective for making the connection of the high heat conductive element and the insulation layer stronger.

This is because the glass component in the sheet "H" was diffused into the insulation ceramic layer and combined with the alumina and glass component thereof during firing, thus making it possible to obtain a wiring base plate having a high mechanical and thermal strength.

Further, as compared with the example VIII, this example has a stable peeling strength, so its joining strength does not vary in response to variation of the firing temperature during manufacturing and therefore variations of the strength among the products are small, thus making it possible to obtain a wiring base substrate which is highly reliable.

EXAMPLE X

Figure 8:
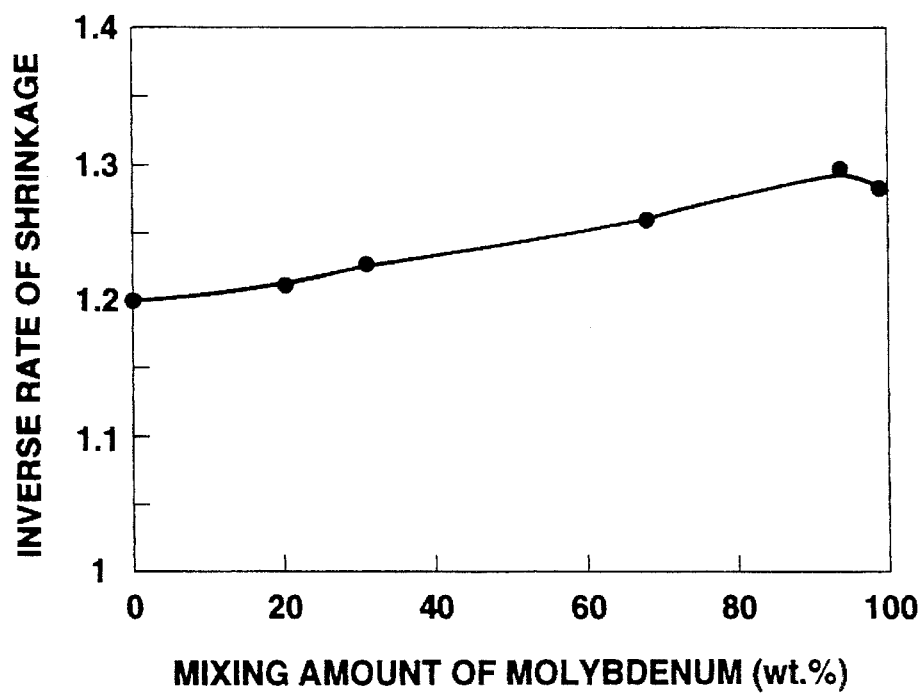
FIG. 8 is a graph showing the relation between a mixing amount of molybdenum in a high heat conductive body and an inverse rate of shrinkage according to the example I.
Figure 9:
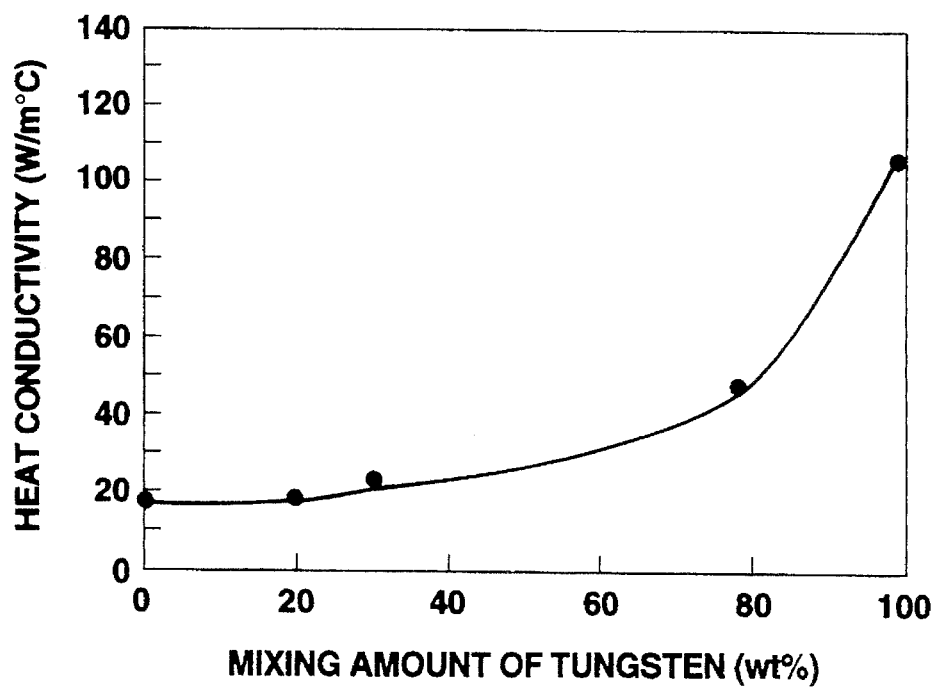
FIG. 9 is a graph showing the relation between a mixing amount of tungsten in a high heat conductive body and a heat conductivity according to an example II.
Figure 10:
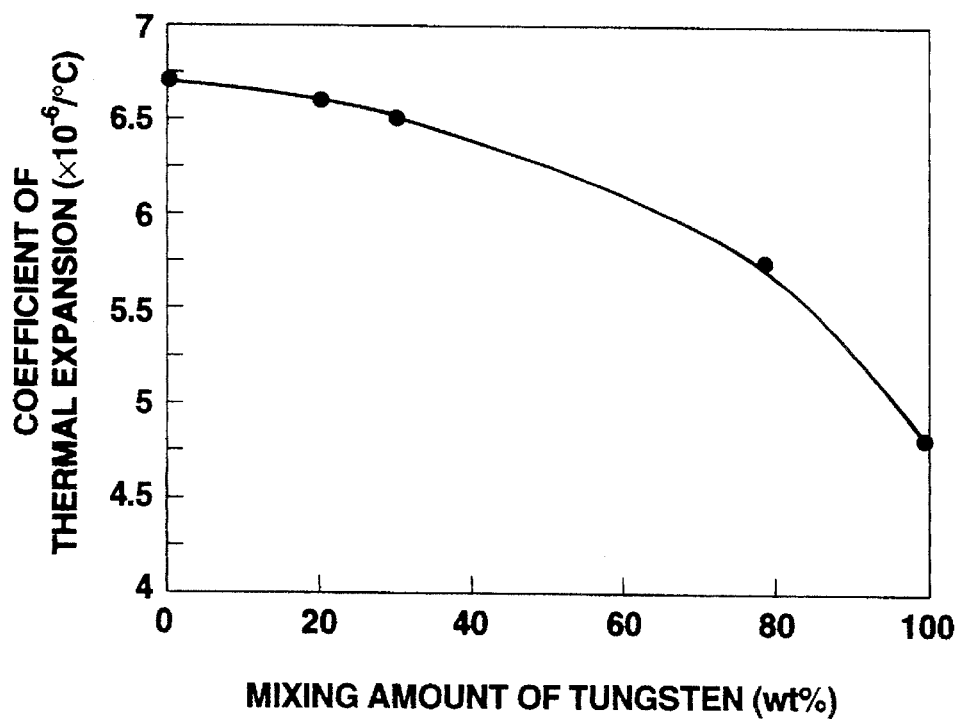
FIG. 10 is a graph showing the relation between a mixing amount of tungsten in a high heat conductive body and coefficient of thermal expansion according to the example II.
Figure 11:
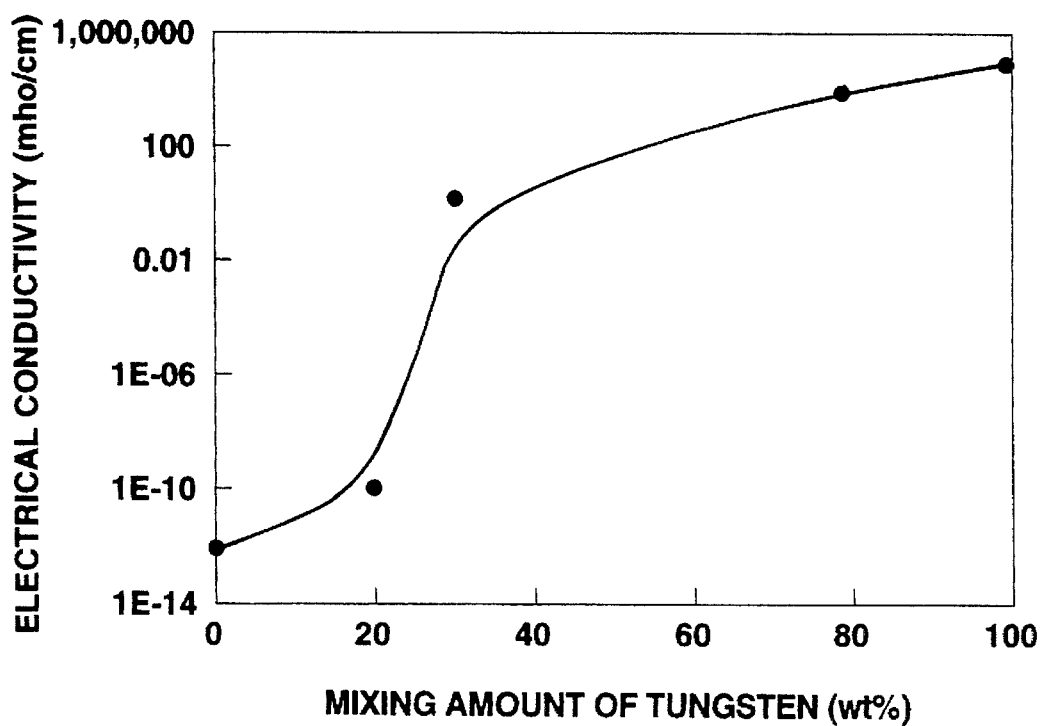
FIG. 11 is a graph showing the relation between a mixing amount of tungsten in a high heat conductive body and an electric conductivity according to the example II.
Figure 12:
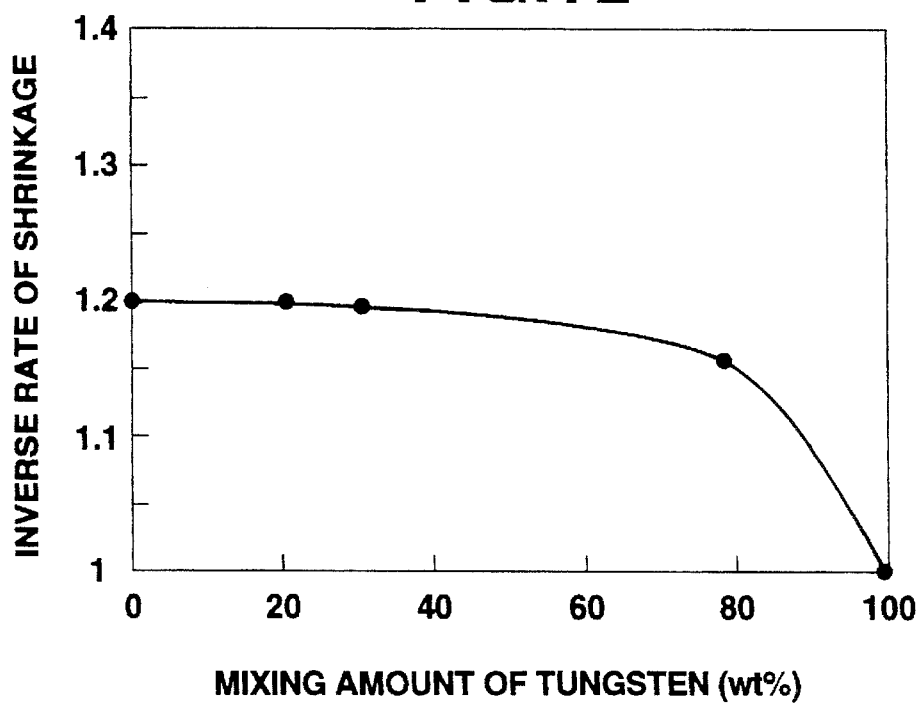
FIG. 12 is a graph showing the relation between a mixing amount of tungsten in a high heat conductive body and an inverse rate of shrinkage according to the example II.

From the Tables I and II and in FIGS. 8 and 12 for the examples I and II, it is revealed that a high heat conductive body containing molybdenum and a high heat conductive body containing tungsten are opposite in the variation characteristic of the inverse rate of shrinkage.

Accordingly, it is apparent that in the layer of the high heat conductive body containing substantially the same amounts of molybdenum and tungsten the molybdenum and tungsten negatively affects each other with respect to the inverse rate of shrinkage so that the amount of its shrinkage becomes substantially equally to that of the insulation ceramic layer having alumina as a main component.

Figure 21:
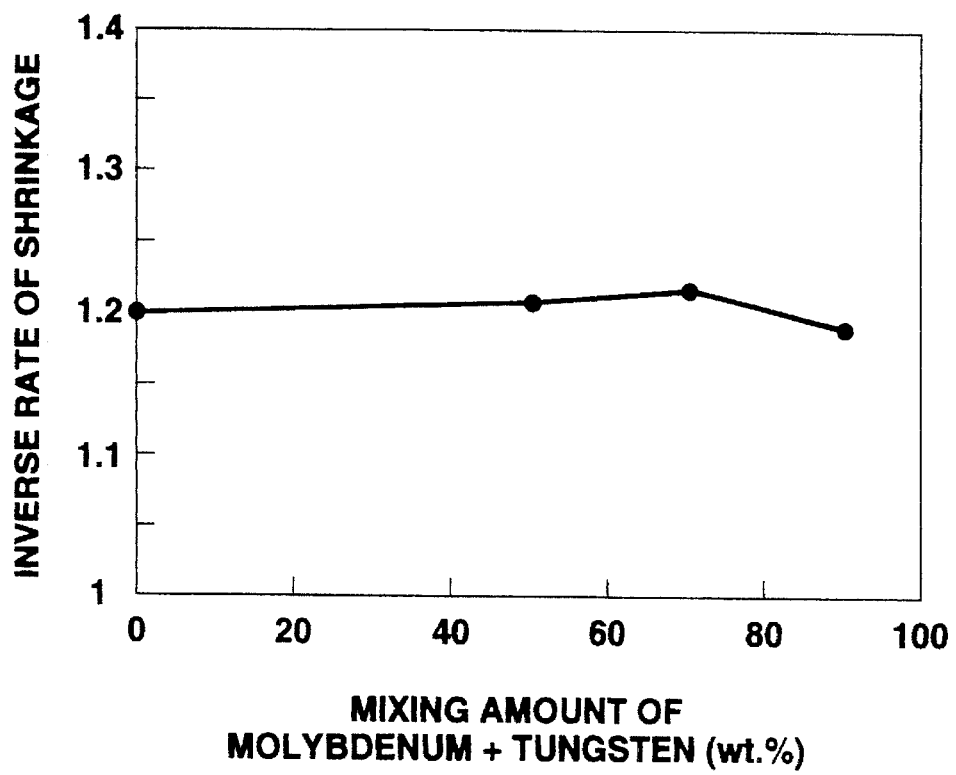
FIG. 21 is a graph showing a variation of an inverse rate of shrinkage relative to a mixing amount of molybdenum and tungsten in a high heat conductive body containing molybdenum and tungsten in an equal amount.

In order to recognize this, a high heat conductive body was produced from a mixture of the same amounts of molybdenum and tungsten powder and 0.5–8 wt. % in total of alumina powder and a glass component, and measurement of the inverse rate of shrinkage was made. The result is shown Table VIII and in FIG. 21.

TABLE VIII

| Mixing Amount of Molybdenum + Tungsten wt. % | Inverse rate of Shrinkage |
|---|---|
| 0 | 1.200 |
| 50 | 1.206 |
| 70 | 1.215 |
| 90 | 1.187 |

As will be apparent from this result, by mixing molybdenum and tungsten which are opposite in variation characteristic of the inverse rate of shrinkage, the inverse rate of shrinkage similar to that of an alumina base substrate can be attained.

Accordingly, by manufacturing an insulation ceramic layer containing alumina as a main component and a wiring base substrate made of such a high heat conductive body by firing at the same time, the stress caused by the difference in the inverse rate of shrinkage between the insulation ceramic layer and the high heat conductive body can be reduced so that the connection thereof can be more stronger or firmer, thus making it possible to obtain a wiring base substrate of a high reliability.

In the meantime, the elements or parts to be joined to the insulation layer and the high heat conductive body are not limited to semiconductor integrated circuit chips and heat radiating fins. That is, other semiconductors such as transistors, diodes and thyristors, SAW devices, electronic parts for light-activated semiconductor integrated circuits, airtight sealing covers, sealing attachment rings for covers, input/output terminals, etc. may be attached to the insulation layer and the high heat conductive body.

In the foregoing, it is to be noted that the high heat conductive body of this invention has a simple composition consisting of ceramic of alumina or a glass component and molybdenum or tungsten and can be produced by utilizing all of the process for producing a conventional ceramic wiring base substrate, so that the high heat conductive body can be produced at a low cost and further its can be machined with ease.

It is further to be noted that the coefficient of thermal expansion of the high heat conductive body of this invention decreases with increase of the content of molybdenum, etc. Accordingly, by setting the coefficient of thermal expansion to a suitable value, the thremal stress arising between a wiring base substrate and an integrated circuit can be reduced.

It is still further to be noted that by varying the contents of molybdenum and tungsten, high heat conductive layers of different heat conductivities and coefficients of thermal expansion can be produced and can be combined for use. Further, by laminating such layers selectively, a desired assembly of high heat conductive layers can be obtained in accordance with the coefficients of thermal expansion of a semiconductor chip and heat radiating fin to be connected to the heat conductive layers.

It is still further to be noted that the high heat conductive body of this invention has an electrical conductivity, so a Ni plating layer or Au plating layer can be directly formed on the high heat conductive body by electroplating. Due to this, a metallizing process otherwise necessitated to provide an electrical conductivity to a prior art insulation ceramic substrate can be dispensed with, and a semiconductor chip, heat radiating fin, or the like can be easily attached to a element made of a high heat conductive body of this invention, thus making it possible to obtain a heat radiating element or a wiring base substrate with a lower cost.

It is still further to be noted that a punched out green sheet for a high heat conductive body and a punched out green sheet for an insulation layer can be laminated and formed into a desired shape and thereafter fired, so it becomes possible to obtain a wiring base substrate can be produced by co-firing in the reducing atmosphere. Accordingly, a process for forming a metaliging layer on a wiring base substrate or a brazing process can be dispensed with. Further, differing from a heat radiating material of Cu-W alloy, the high heat conductive body can be produced at one time by utilizing the firing process of a conventional wiring base substrate. Further, since the high heat conductive layer and the insulation layer are joined directly and integrally, the reliability on the air tightness can be increased.

It is further to be noted that an insulation layer can be easily formed or lain on the high heat conductive body by coating glass or polyimide.

It is still further to be noted that by adjusting the contents of molybdenum and tungsten the inverse rates of the insulation layer and the high heat conductive layer can be approximated to each other, whereby the thermal stress arising at the time of co-firing can be reduced for thereby joining the both more firmly and therefore a ceramic wiring base substrate of a high reliability can be obtained.

It is still further to be noted that the high heat conductive body of this invention can be produced by utilizing a material such as alumina ceramic and mullite which is cheap and produced by a stable production process and by utilizing the production process thereof, so the ceramic wiring base substrate of this invention can be produced at a lower cost as compared with the wiring base substrate of aluminum nitride ceramic the raw material of which is costly and the production process of which is unstable.

What is claimed is:

1. A high heat conductive body having a high heat radiation property and a low coefficient of thermal expansion, consisting of 60–99 wt. % of at least one of molybdenum or tungsten and 1 or more wt. % of alumina.

2. A high heat conductive body according to claim 1, consisting of 60–99 wt. % molybdenum.

3. A high heat conductive body according to claim 1, consisting of 60–99 wt. % tungsten.

4. A high heat conductive body according to claim 1, consisting of 60–99 wt. % of a combination of molybdenum and tungsten.

5. A high heat conductive body having a high heat radiation property and a low coefficient of thermal expansion, consisting of 60–99 wt. % of at least one of molybdenum or tungsten and 1 or more wt. % of mullite.

6. A high heat conductive body according to claim 5, consisting of 60–99 wt. % molybdenum.

7. A high heat conductive body according to claim 5, consisting of 60–99 wt. % tungsten.

8. A high heat conductive body according to claim 5, consisting of 60–99 wt. % of a combination of molybdenum and tungsten.

* * * * *